(12) United States Patent
Chuang

(10) Patent No.: US 12,720,843 B2
(45) Date of Patent: Aug. 25, 2026

(54) SEMICONDUCTOR DEVICE WITH RECESSED GATE AND METHOD FOR FABRICATING THE SAME

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 332 days.

(21) Appl. No.: 18/509,622

(22) Filed: Nov. 15, 2023

(65) Prior Publication Data

US 2025/0072090 A1 Feb. 27, 2025

Related U.S. Application Data

(62) Division of application No. 18/236,490, filed on Aug. 22, 2023, now Pat. No. 12,641,857.

(51) Int. Cl.
*H10D 64/27* (2025.01)

(52) U.S. Cl.
CPC ......... *H10D 64/513* (2025.01); *H10D 64/518* (2025.01)

(58) Field of Classification Search
CPC ............... H10D 64/513; H10D 64/518; H10D 64/01328; H10D 64/013; H10B 12/053; H10B 12/09
See application file for complete search history.

(56) References Cited

U.S. PATENT DOCUMENTS

| | | | | |
|---|---|---|---|---|
| 6,184,086 | B1 | 2/2001 | Kao | |
| 6,716,046 | B2 | 4/2004 | Mistry | |
| 2003/0020102 | A1* | 1/2003 | Gajda | H10D 12/038 257/E21.384 |
| 2008/0067584 | A1 | 3/2008 | Lui et al. | |

(Continued)

FOREIGN PATENT DOCUMENTS

| | | | |
|---|---|---|---|
| TW | 202008437 | A | 2/2020 |
| TW | 202230731 | A | 8/2022 |

OTHER PUBLICATIONS

Office Action and and the search report mailed on Jan. 9, 2025 related to Taiwanese Application No. 113112710.

(Continued)

*Primary Examiner* — Su C Kim
(74) *Attorney, Agent, or Firm* — Xuan Zhang

(57) ABSTRACT

The present application discloses a semiconductor device and a method for fabricating the semiconductor device. The semiconductor device includes a substrate; a recessed gate dielectric layer inwardly positioned in the substrate and including a U-shaped cross-sectional profile; a recessed gate bottom conductive layer positioned on the recessed gate dielectric layer and including a valley-shaped cross-sectional profile, resulting in a first valley; a recessed gate top conductive layer conformally positioned on the first valley of the recessed gate bottom conductive layer; and a recessed gate capping layer positioned on the recessed gate top conductive layer.

13 Claims, 31 Drawing Sheets

(56) References Cited

U.S. PATENT DOCUMENTS

| | | | | |
|---|---|---|---|---|
| 2008/0305636 | A1* | 12/2008 | Kim | H01L 21/0337 257/E21.249 |
| 2010/0105182 | A1 | 4/2010 | Tai et al. | |
| 2013/0302968 | A1* | 11/2013 | Lin | H10B 12/488 438/424 |
| 2021/0028286 | A1 | 1/2021 | An et al. | |
| 2021/0118996 | A1 | 4/2021 | Liaw | |

OTHER PUBLICATIONS

Summary translation of Office Action and and the search report mailed on Jan. 9, 2025 related to Taiwanese Application No. 113112710.

Office Action and search report mailed on May 3, 2024 related to Taiwanese Application No. 112134064.

Office Action and and the search report mailed on Feb. 3, 2026 related to U.S. Appl. No. 18/236,490.

Office Action and and the search report mailed on Nov. 5, 2025 related to U.S. Appl. No. 18/236,490.

* cited by examiner

Figure 1:
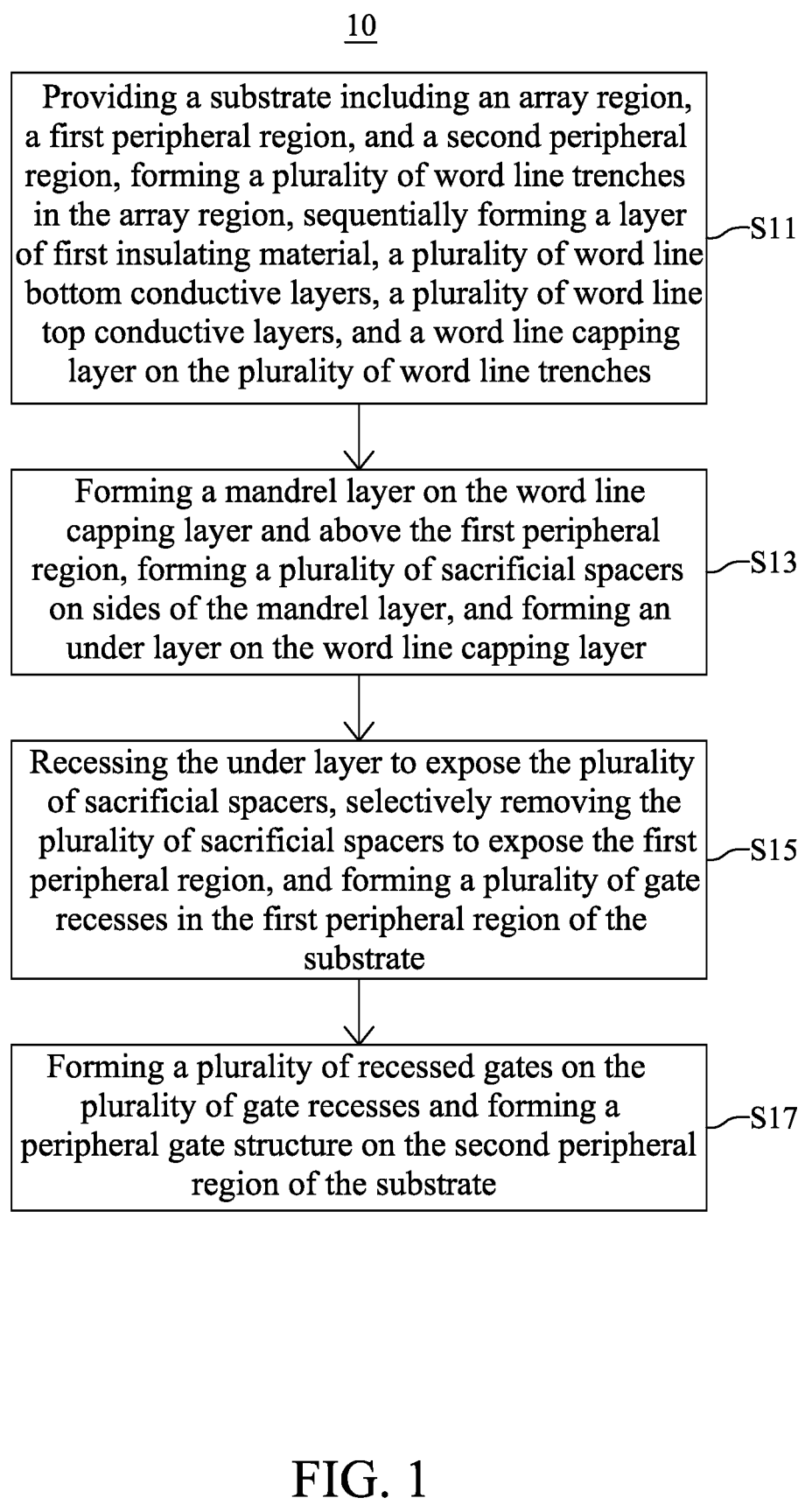

10

Providing a substrate including an array region, a first peripheral region, and a second peripheral region, forming a plurality of word line trenches in the array region, sequentially forming a layer of first insulating material, a plurality of word line bottom conductive layers, a plurality of word line top conductive layers, and a word line capping layer on the plurality of word line trenches — S11

Forming a mandrel layer on the word line capping layer and above the first peripheral region, forming a plurality of sacrificial spacers on sides of the mandrel layer, and forming an under layer on the word line capping layer — S13

Recessing the under layer to expose the plurality of sacrificial spacers, selectively removing the plurality of sacrificial spacers to expose the first peripheral region, and forming a plurality of gate recesses in the first peripheral region of the substrate — S15

Forming a plurality of recessed gates on the plurality of gate recesses and forming a peripheral gate structure on the second peripheral region of the substrate — S17

SEMICONDUCTOR DEVICE WITH RECESSED GATE AND METHOD FOR FABRICATING THE SAME

CROSS-REFERENCE TO RELATED APPLICATION

This application is a divisional application of U.S. Non-Provisional application Ser. No. 18/236,490 filed Aug. 22, 2023, which is incorporated herein by reference in its entirety.

TECHNICAL FIELD

The present disclosure relates to a semiconductor device and a method for fabricating the semiconductor device, and more particularly, to a semiconductor device with a recessed gate and a method for fabricating the semiconductor device with the recessed gate.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a recessed gate dielectric layer inwardly positioned in the substrate and including a U-shaped cross-sectional profile; a recessed gate bottom conductive layer positioned on the recessed gate dielectric layer and including a valley-shaped cross-sectional profile, resulting in a first valley; a recessed gate top conductive layer conformally positioned on the first valley of the recessed gate bottom conductive layer; and a recessed gate capping layer positioned on the recessed gate top conductive layer.

Another aspect of the present disclosure provides a semiconductor device including a substrate including a first peripheral region and a second peripheral region; a plurality of recessed gates respectively including a recessed gate dielectric layer inwardly positioned in the first peripheral region and including a U-shaped cross-sectional profile, a recessed gate bottom conductive layer positioned on the recessed gate dielectric layer and including a valley-shaped cross-sectional profile, resulting in a first valley, a recessed gate top conductive layer conformally positioned on the first valley of the recessed gate bottom conductive layer, and a recessed gate capping layer positioned on the recessed gate top conductive layer; and a peripheral gate structure positioned on the second peripheral region. An element density of the first peripheral region is greater than an element density of the second peripheral region.

Another aspect of the present disclosure provides a method for fabricating a semiconductor device including providing a substrate including a first peripheral region and a second peripheral region; forming a mandrel layer on the first peripheral region; conformally forming a layer of spacer material on the substrate and covering the mandrel layer; performing a spacer etching process to turn the layer of spacer material into a plurality of sacrificial spacers on sides of the mandrel layer; forming an under layer on the substrate and covering the mandrel layer and the plurality of sacrificial spacers; recessing the under layer to expose the mandrel layer and the plurality of sacrificial spacers; selectively removing the plurality of sacrificial spacers to expose the first peripheral region; forming a plurality of gate recesses in the first peripheral region; and forming a plurality of recessed gates on the plurality of gate recesses.

Due to the design of the semiconductor device of the present disclosure, the leakage issue associated with smaller gate sizes may be effectively controlled by utilizing the recessed gate dielectric layer. Furthermore, both the recessed gates (e.g., recessed gate) and the planar gates (e.g., peripheral gate structure) can be fabricated simultaneously, potentially leading to reduced manufacturing costs.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

FIGS. 21 to 26 are close-up schematic cross-sectional view diagrams illustrating part of the flow for fabricating the semiconductor device in accordance with one embodiment of the present disclosure;

DETAILED DESCRIPTION

Figure 2:
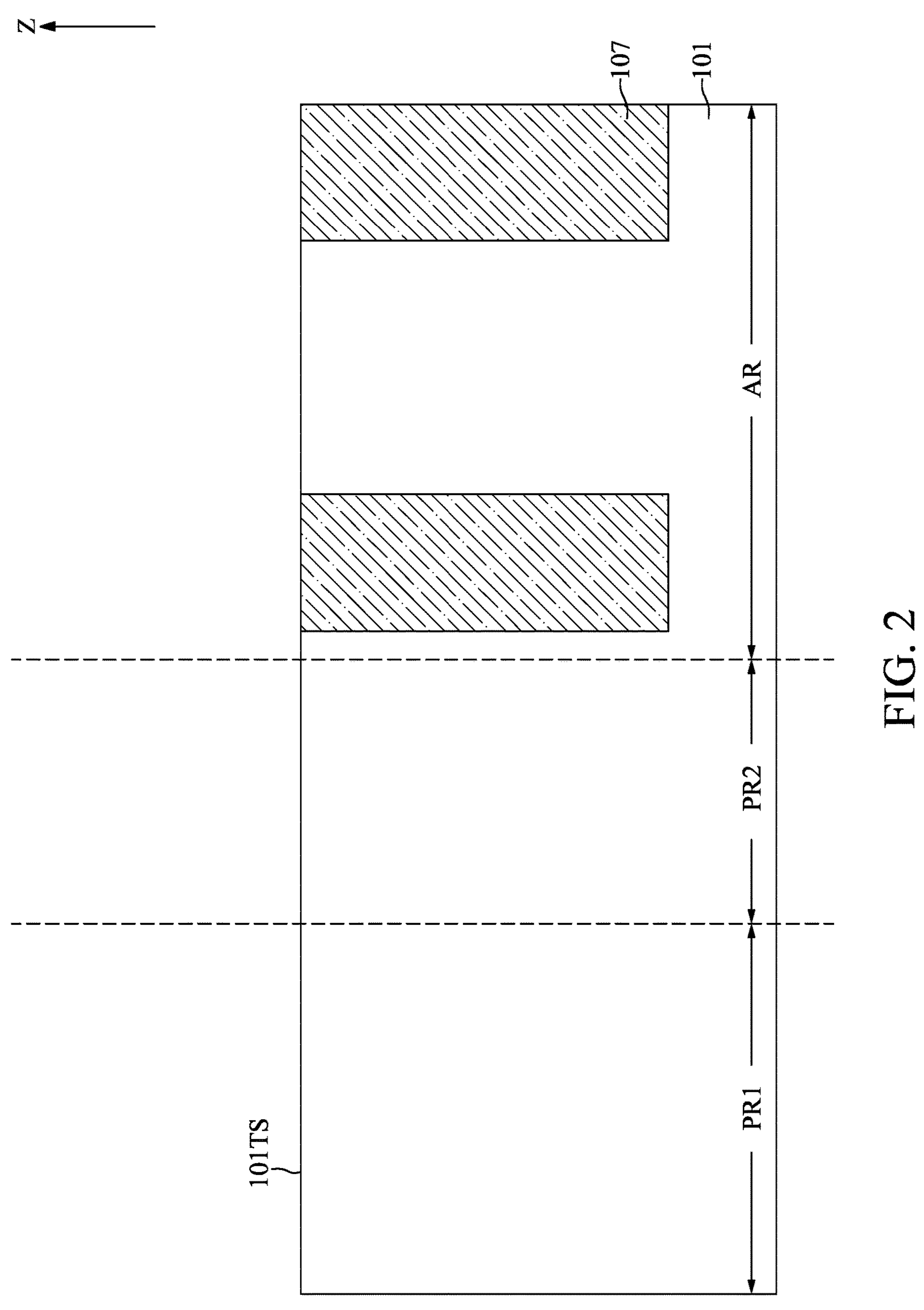
FIGS. 2 to 20 illustrate, in schematic cross-sectional view diagrams, part of a flow for fabricating the semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 20 illustrate, in schematic cross-sectional view diagrams, part of a flow for fabricating the semiconductor device 1A in accordance with one embodiment of the present disclosure. FIGS. 21 to 26 are close-up schematic cross-sectional view diagrams illustrating part of the flow for fabricating the semiconductor device 1A in accordance with one embodiment of the present disclosure. FIG. 27 illustrates, in a schematic cross-sectional view diagram, part of the flow for fabricating the semiconductor device 1A in accordance with one embodiment of the present disclosure.

With reference to FIGS. 1 to 9, at step S11, a substrate 101 including an array region AR, a first peripheral region PR1, and a second peripheral region PR2 may be provided, a plurality of word line trenches 103-1, 103-3 may be formed in the array region AR, a layer of first insulating material 711, a plurality of word line bottom conductive layers 203, a plurality of word line top conductive layers 205, and a word line capping layer 207 may be sequentially formed on the plurality of word line trenches 103-1, 103-3.

With reference to FIG. 2, in some embodiments, the array region AR and the first peripheral region PR1 may be adjacent to each other. For example, the array region AR may be surrounded by the first peripheral region PR1 in a top-view perspective (not shown). In some embodiments, the first peripheral region PR1 and the second peripheral region PR2 may be adjacent to each other. For example, the first peripheral region PR1 may be surrounded by the second peripheral region PR2 in a top-view perspective (not shown). In some embodiments, the first peripheral region PR1 and the second peripheral region PR2 may be separated from each other. It should be noted that the array region AR may comprise a portion of the substrate 101 and a space above the portion of the substrate 101. Describing an element as being disposed on the array region AR means that the element is disposed on a top surface of the portion of the substrate 101. Describing an element as being disposed in the array region AR means that the element is disposed in the portion of the substrate 101; however, a top surface of the element may be even with the top surface of the portion of the substrate 101. Describing an element as being disposed above the array region AR means that the element is disposed above the top surface of the portion of the substrate 101. Accordingly, the first peripheral region PR1 and the second peripheral region PR2 may comprise other portions of the substrate 101 and space above the other portions of the substrate 101, respectively.

With reference to FIG. 2, the substrate 101 may be a bulk semiconductor substrate. The bulk semiconductor substrate may be formed of, for example, an elementary semiconductor such as silicon or germanium or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIG. 2, an isolation layer 107 may be formed in the substrate 101. For example, the isolation layer 107 may be formed in the array region AR of the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface 101TS of the substrate 101 is exposed to remove excess filling material, provide a substantially flat surface for subsequent processing steps, and concurrently form the isolation layer 107. The insulating material may be, for example, silicon oxide or other applicable insulating materials.

Figure 3:
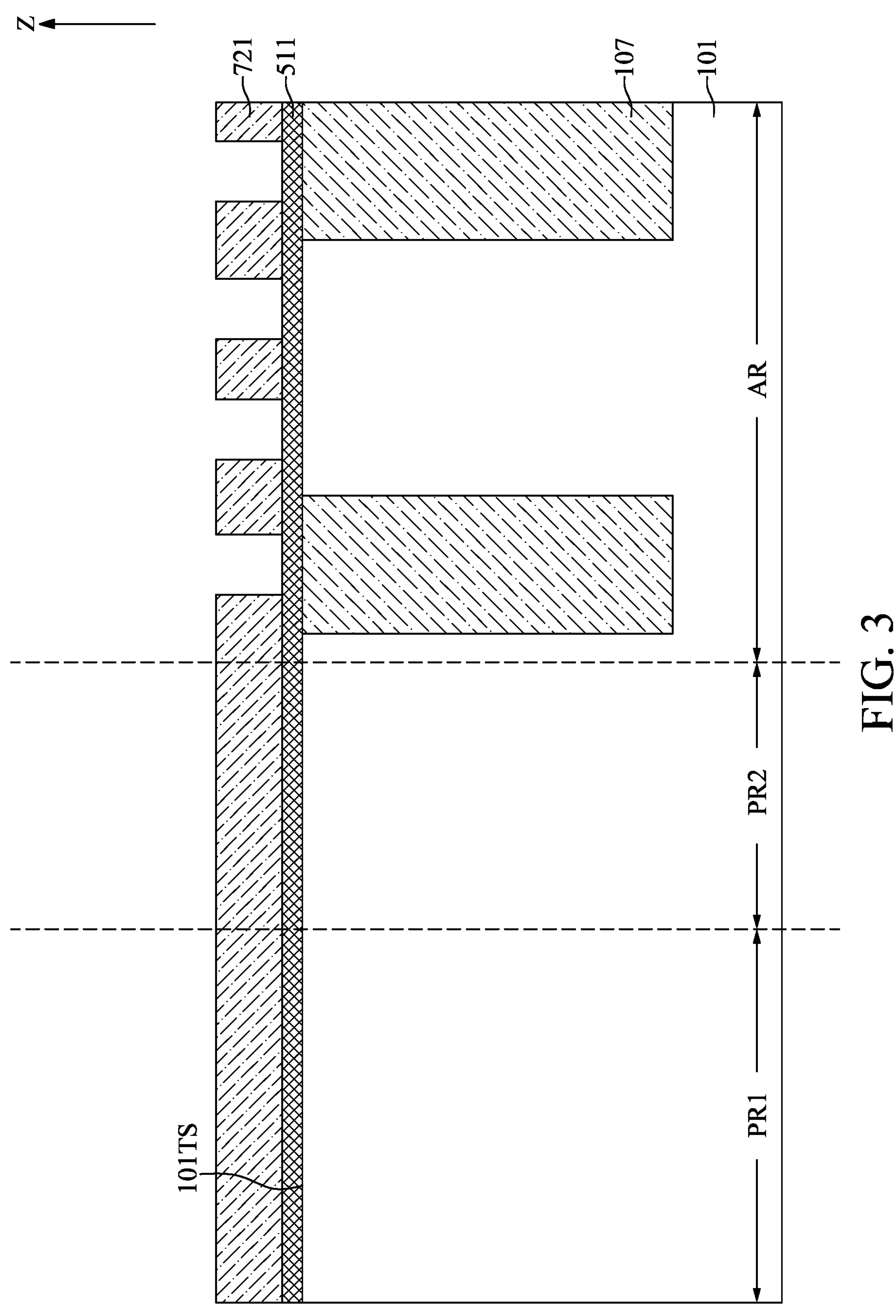

With reference to FIG. 3, a first hard mask layer 511 may be formed on the substrate 101. In some embodiments, the first hard mask layer 511 may be formed of a material having etching selectivity to the substrate 101. In some embodiments, the first hard mask layer 511 may be formed of a material having etching selectivity to the substrate 101 and the isolation layer 107. In some embodiments, the first hard mask layer 511 may be formed of, for example, silicon nitride, boron nitride, silicon boron nitride, phosphorus boron nitride, or boron carbon silicon nitride. In some embodiments, the first hard mask layer 511 may be formed by, for example, atomic layer deposition, chemical vapor deposition, or other applicable deposition processes.

In some embodiments, the first hard mask layer 511 may be formed by a film formation process and a treatment process. Detailedly, in the film formation process, first precursors, which may be boron-based precursors, may be introduced over the substrate 101 to form a boron-based layer. Subsequently, in the treatment process, second precursors, which may be nitrogen-based precursors, may be introduced to react with the boron-based layer and turn the boron-based layer into the first hard mask layer 511.

In some embodiments, the first precursors may be, for example, diborane, borazine, or an alkyl-substituted derivative of borazine. In some embodiments, the first precursors may be introduced at a flow rate between about 5 sccm and about 50 slm (standard liter per minute) or between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm or between about 1 slm and about 10 slm.

In some embodiments, the film formation process may be performed without an assistant of plasma. In such a situation, the substrate temperature of the film formation process may be between about 100° C. and about 1000° C. For example, the substrate temperature of the film formation process may be between about 300° C. and about 500° C. The process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such a situation, the substrate temperature of the film formation process may be between about 100° C. and about 1000° C. For example, the substrate temperature of the film formation process may be between about 300° C. and about 500° C. The process pressure of the film formation process may be between about 10 mTorr and about 760 Torr. For example, the process pressure of the film formation process may be between about 2 Torr and about 10 Torr. The plasma may be generated by a RF power between 2 W and 5000 W. For example, the RF power may be between 30 W and 1000 W.

In some embodiments, the second precursors may be, for example, ammonia or hydrazine. In some embodiments, the second precursors may be introduced at a flow rate between about 5 sccm and about 50 slm or between about 10 sccm and about 1 slm.

In some embodiments, oxygen-based precursors may be introduced with the second precursors in the treatment process. The oxygen-based precursors may be, for example, oxygen, nitric oxide, nitrous oxide, carbon dioxide, or water.

In some embodiments, silicon-based precursors may be introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be introduced with the second precursors in the treatment process. The phosphorus-based precursors may be, for example, phosphine.

In some embodiments, oxygen-based precursors, silicon-based precursors, or phosphorus-based precursors may be introduced with the second precursors in the treatment process.

In some embodiments, the treatment process may be performed with an assistant of a plasma process, a UV cure process, a thermal anneal process, or a combination thereof.

When the treatment is performed with the assistance of the plasma process. The plasma of the plasma process may be generated by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency greater than about 13.6 MHz. In such a situation, a substrate temperature of the treatment process may be between about 20° C. and about 1000° C. The process pressure of the treatment process may be between about 10 mTorr and about 760 Torr.

When the treatment is performed with the assistance of the UV cure process, in such a situation, the substrate temperature of the treatment process may be between about 20° C. and about 1000° C. The process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV, or between about 1 eV and about 6 eV. The assistance of the UV cure process may remove hydrogen from the first hard mask layer 511. As hydrogen may diffuse through into other areas of the semiconductor device 1A and may degrade the reliability of the semiconductor device 1A, the removal of hydrogen by the assistance of UV cure process may improve the reliability of the semiconductor device 1A. In addition, the UV cure process may increase the density of the first hard mask layer 511.

When the treatment is performed with the assistant of the thermal anneal process. In such a situation, a substrate temperature of the treatment process may be between about 20° C. and about 1000° C. The process pressure of the treatment process may be between about 10 mTorr and about 760 Torr.

With reference to FIG. 3, a first mask layer 721 may be formed on the first hard mask layer 511. In some embodiments, the first mask layer 721 may be a photoresist layer and may include a pattern of the plurality of word line structures 200.

Figure 4:
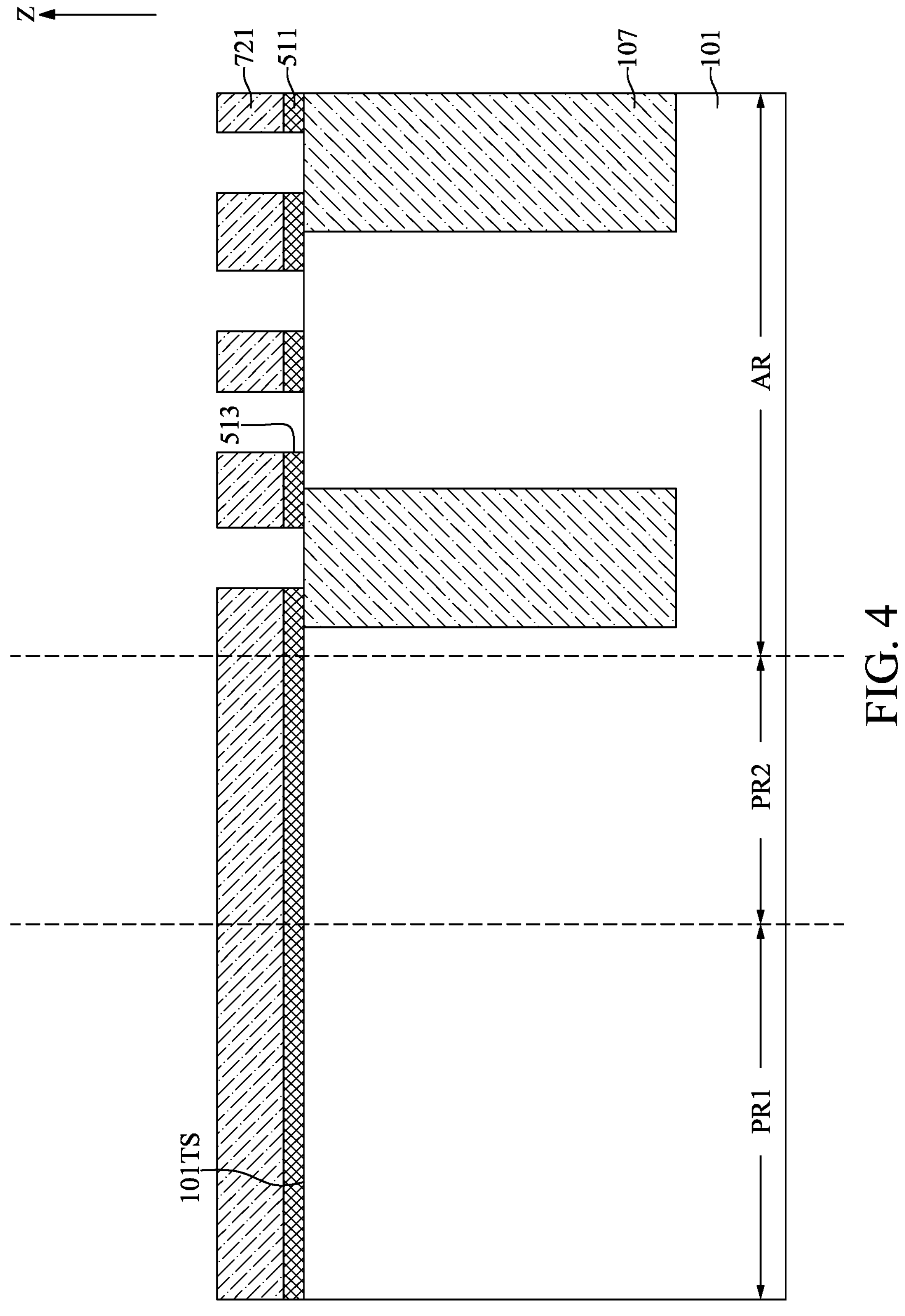

With reference to FIG. 4, an etching process may be performed to remove a portion of the first hard mask layer 511. In some embodiments, the etch rate ratio of the first hard mask layer 511 to the substrate 101 may be between about 100:1 and about 2:1, between about 15:1 and about 2:1, or between about 10:1 and about 2:1 during the etching process. In some embodiments, the etch rate ratio of the first hard mask layer 511 to the isolation layer 107 may be between about 100:1 and about 2:1, between about 15:1 and about 2:1, or between about 10:1 and about 2:1 during the etching process. The pattern of the first mask layer 721 may be transferred to the first hard mask layer 511 and may be referred to as the first pattern 513. Portions of the isolation layer 107 and portions of the substrate 101 may be exposed through the first pattern 513. After the etching process, the first mask layer 721 may be removed by ashing or other applicable processes.

Figure 5:
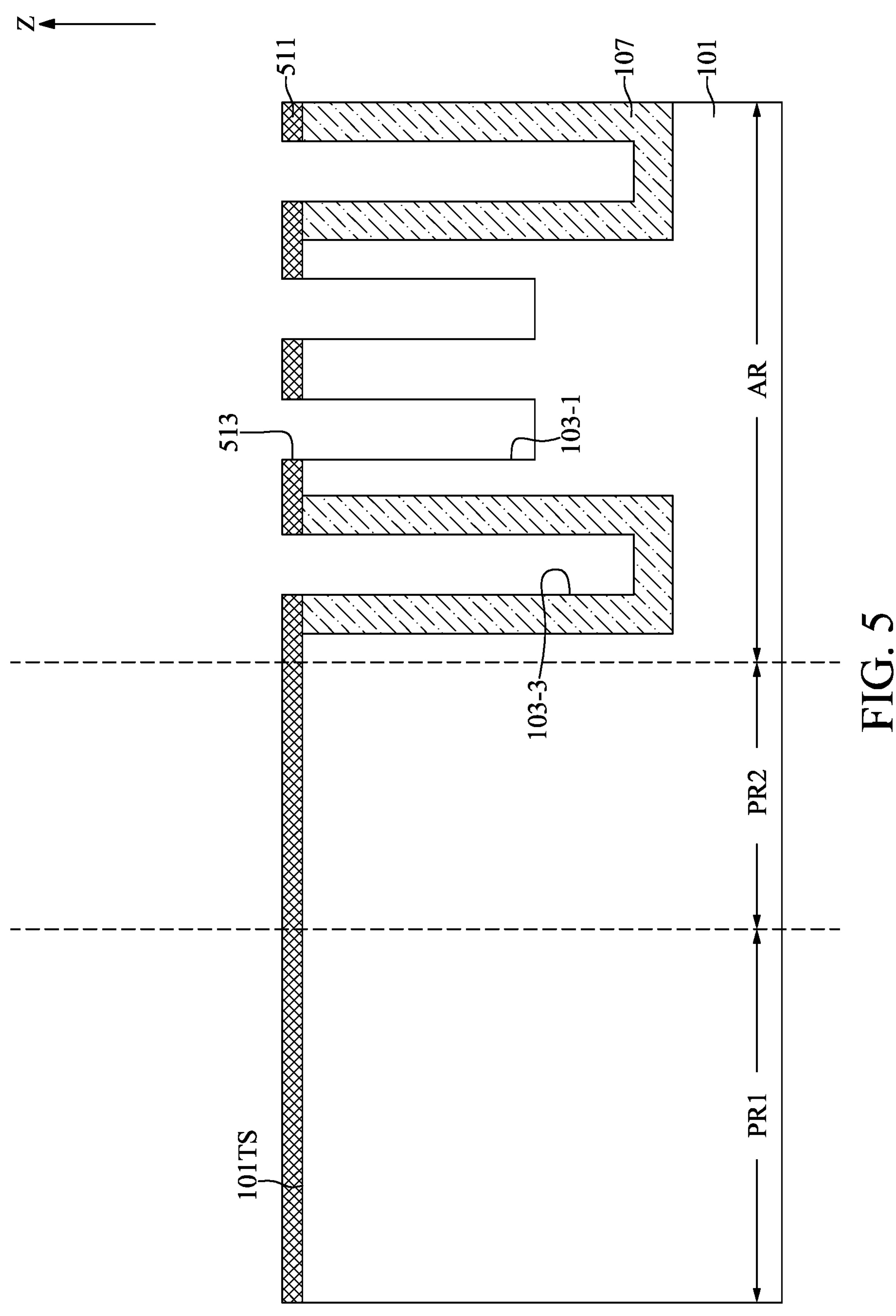

With reference to FIG. 5, a trench etching process may be performed using the first hard mask layer 511 as a mask to remove portions of the isolation layer 107 and portions of the substrate 101 and concurrently form the plurality of word line trenches 103-1, 103-3. In some embodiments, the plurality of word line trenches 103-1 formed in the substrate 101 may be shallower than the plurality of word line trenches 103-3 formed in the isolation layer 107. In some embodiments, the etch rate ratio of the isolation layer 107 to the first hard mask layer 511 may be between about 100:1 and about 5:1, between about 15:1 and about 5:1, or between about 10:1 and about 5:1 during the trench etching process. In some embodiments, the etch rate ratio of the substrate 101 to the first hard mask layer 511 may be between about 80:1 and about 5:1, between about 10:1 and about 5:1, or between about 8:1 and about 5:1 during the trench etching process.

Figure 6:
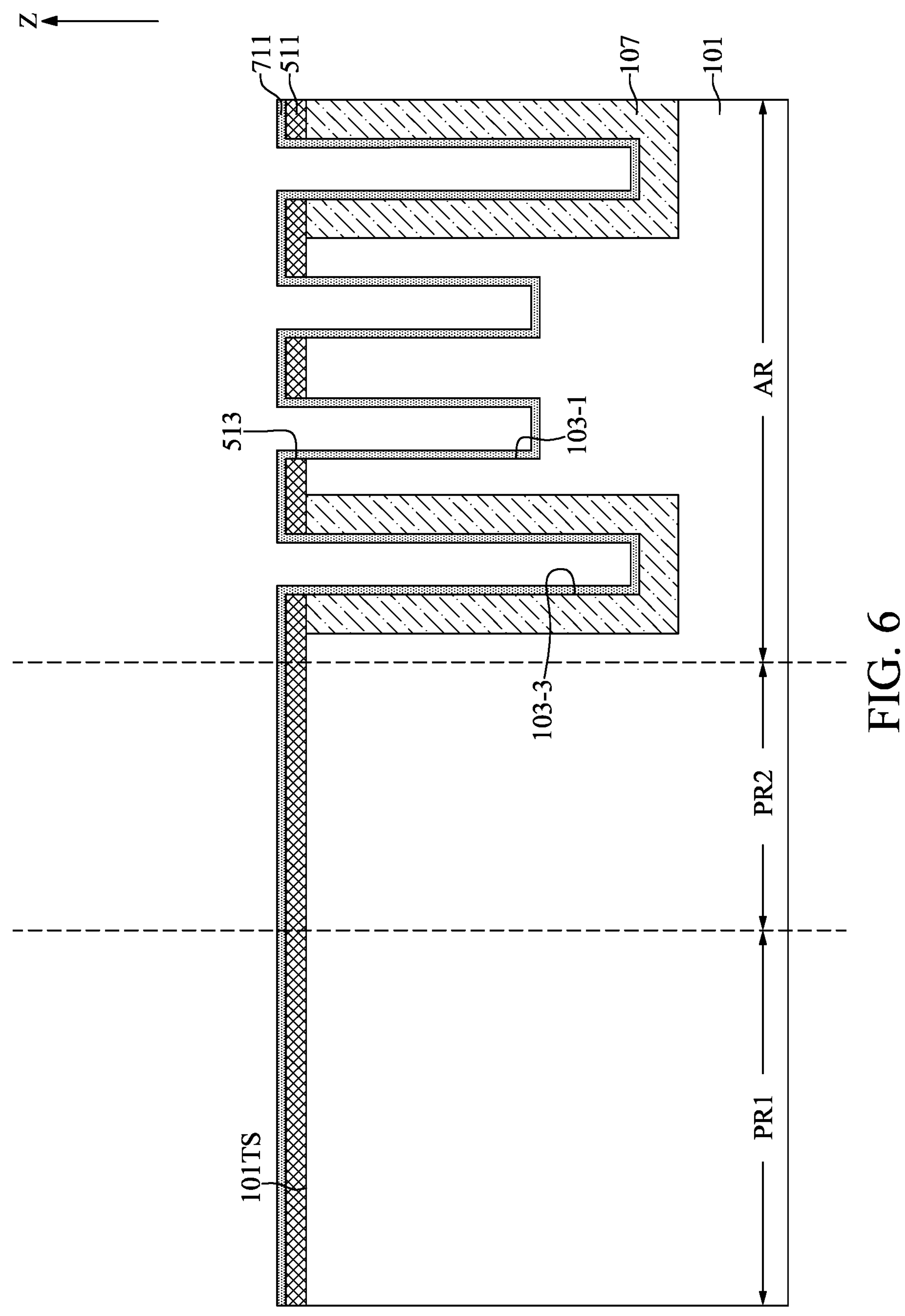

With reference to FIG. 6, the layer of first insulating material 711 may be conformally formed on the first hard mask layer 511 and in the plurality of word line trenches 103-1, 103-3. The layer of first insulating material 711 may have a U-shaped cross-sectional profile in the plurality of word line trenches 103-1, 103-3. In some embodiments, the layer of first insulating material 711 may have a thickness in a range of about 1 nm to about 7 nm, including about 1 nm, about 2 nm, about 3 nm, about 4 nm, about 5 nm, about 6 nm, or about 7 nm.

In some embodiments, the layer of first insulating material 711 may be formed by a thermal oxidation process. For example, the layer of first insulating material 711 may be formed by oxidizing the surface of the plurality of word line trenches 103-1, 103-3. In some embodiments, the layer of first insulating material 711 may be formed by a deposition process such as a chemical vapor deposition or an atomic layer deposition. The first insulating material 711 may include a high-k material, an oxide, a nitride, an oxynitride or combinations thereof. In some embodiments, after a liner polysilicon layer (not shown for clarity) is deposited, the layer of first insulating material 711 may be formed by radical oxidizing the liner polysilicon layer. In some embodiments, after a liner silicon nitride layer (not shown for clarity) is formed, the layer of first insulating material 711 may be formed by radical oxidizing the liner silicon nitride layer.

In some embodiments, the high-k dielectric material may include a hafnium-containing material. The hafnium-containing material may be, for example, hafnium oxide, hafnium silicon oxide, hafnium silicon oxynitride, or a combination thereof. In some embodiments, the high-k dielectric material may be, for example, lanthanum oxide, lanthanum aluminum oxide, zirconium oxide, zirconium silicon oxide, zirconium silicon oxynitride, aluminum oxide or a combination thereof.

Figure 7:
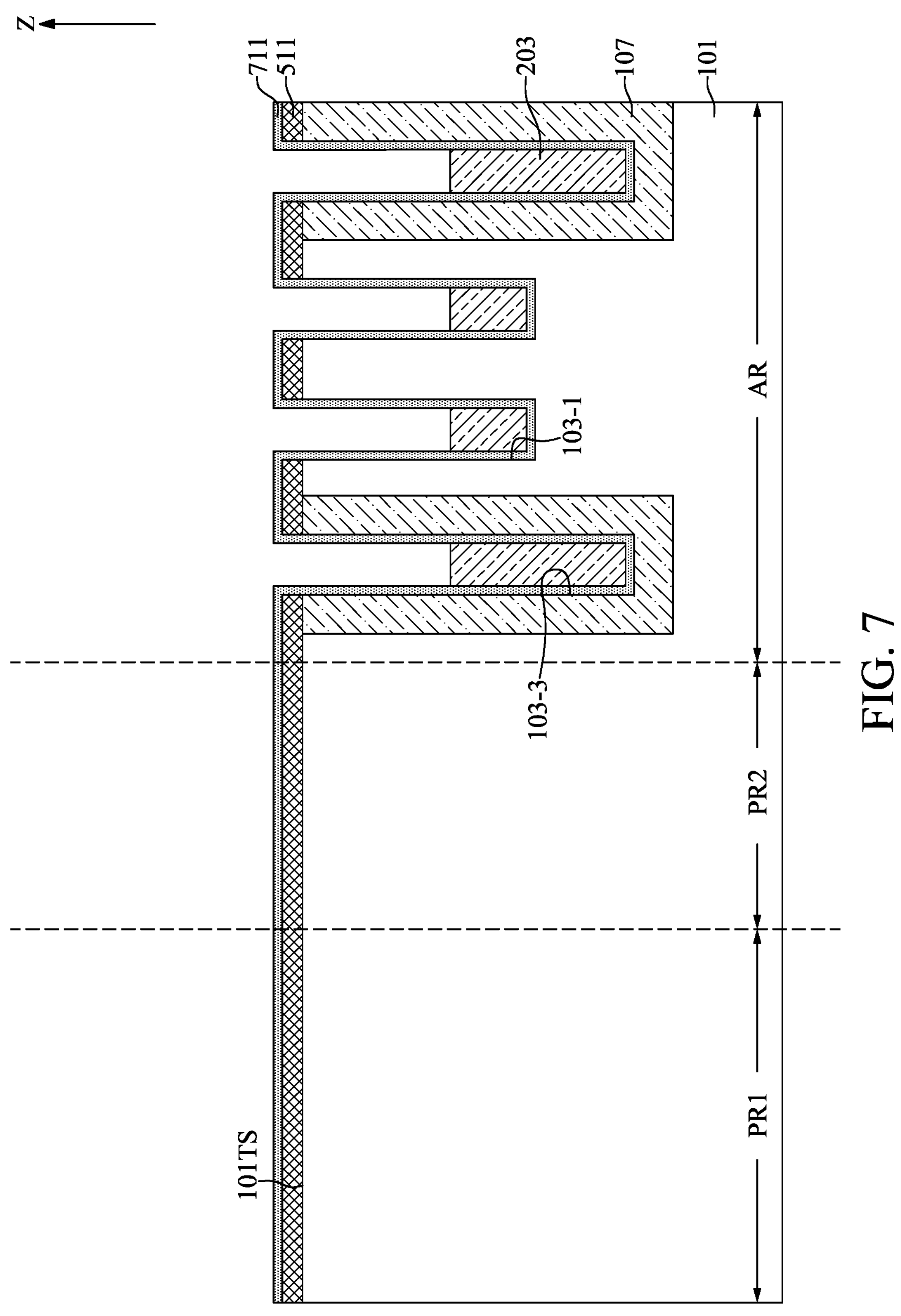

With reference to FIG. 7, the plurality of word line bottom conductive layers 203 may be formed in the plurality of word line trenches 103-1, 103-3, respectively and correspondingly. For example, a conductive material (not shown) may be formed to fill the plurality of word line trenches 103-1, 103-3. An etching back process may be subsequently performed to partially remove the conductive material formed in the plurality of word line trenches 103-1, 103-3 and concurrently form the plurality of word line bottom conductive layers 203. In some embodiments, the conductive material may be a work function material such as, titanium, titanium nitride, silicon, silicon germanium, or a combination thereof. It should be noted that the term "work function" refers to the bulk chemical potential of a material (e.g., metal) relative to the vacuum level.

For example, in the present embodiment, the conductive material is titanium nitride and may be formed by chemical vapor deposition. In some embodiments, the deposition of the conductive material may include a source gas introducing step, a first purging step, a reactant flowing step, and a second purging step. The source gas introducing step, the first purging step, the reactant flowing step, and the second purging step may be referred to as one cycle. Multiple cycles may be performed to fill the plurality of word line trenches 103-1, 103-3.

Detailedly, the intermediate semiconductor device illustrated in FIG. 6 may be loaded in a reaction chamber. In the source gas introducing step, source gases containing a precursor and a reactant may be introduced to the reaction chamber containing the intermediate semiconductor device. The precursor and the reactant may diffuse across the boundary layer and reach the surface of the intermediate semiconductor device. The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, a purge gas such as argon may be injected into the reaction chamber to purge out the gaseous byproducts, unreacted precursor, and unreacted reactant.

In the reactant flowing step, the reactant may be solely introduced to the reaction chamber to turn the continuous thin film into a titanium nitride layer. In the second purging step, a purge gas such as argon may be injected into the reaction chamber to purge out the gaseous byproducts and unreacted reactant.

In some embodiments, the deposition of the conductive material using chemical vapor deposition may be performed with the assistance of plasma. The source of the plasma may be, for example, argon, hydrogen, or a combination thereof.

For example, the precursor may be titanium tetrachloride. The reactant may be ammonia. Titanium tetrachloride and ammonia may react on the surface and form a titanium nitride layer including high chloride contamination due to incomplete reaction between titanium tetrachloride and ammonia. The ammonia in the reactant flowing step may reduce the chloride content of the titanium nitride layer.

In some embodiments, the etch rate ratio of the word line bottom conductive layer 203 to the first insulating material 711 may be between about 100:1 and about 5:1, between about 15:1 and about 5:1, or between about 10:1 and about 5:1 during the etching back process.

Figure 8:
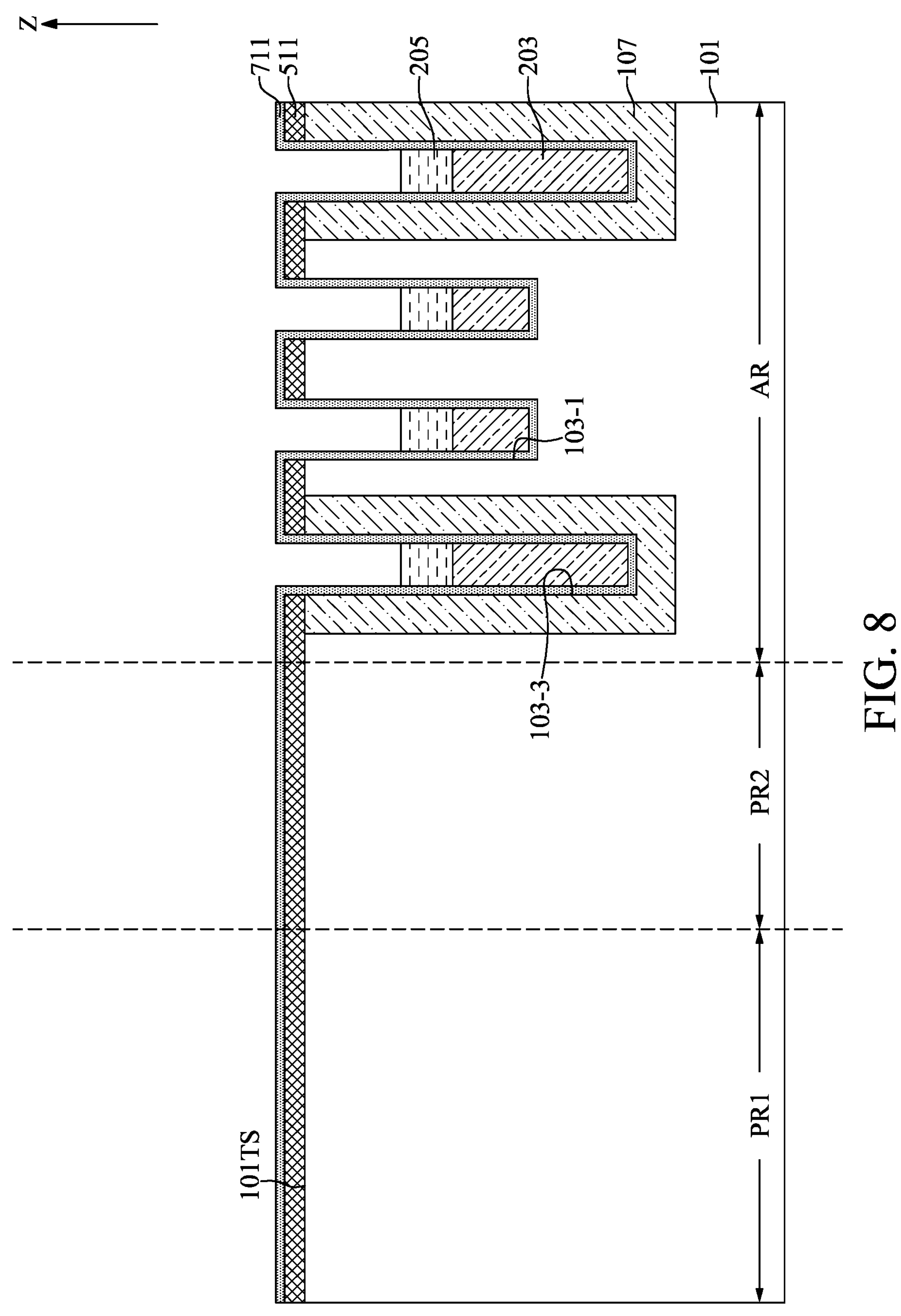

With reference to FIG. 8, the plurality of word line top conductive layers 205 may be formed in the plurality of word line trenches 103-1, 103-3. In some embodiments, the plurality of word line top conductive layers 205 may be formed of, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the plurality of word line top conductive layers 205 may be doped with p-type dopants or n-type dopants. In some embodiments, a conductive material such as polycrystalline silicon, polycrystalline germanium, or polycrystalline silicon germanium may be deposited into the plurality of word line trenches 103-1, 103-3. An etching back process may be subsequently performed to remove portions of the conductive to form the plurality of word line top conductive layers 205. In some embodiments, the dopants may be incorporated into the deposition process of the conductive material. In some embodiments, the dopants may be doped using an implantation process after the etching back process.

The term “p-type dopant” refers to an impurity that when added to an intrinsic semiconductor material creates deficiencies of valence electrons. In a silicon containing semiconductor material, examples of p-type dopants include, but are not limited to, boron, aluminum, gallium or indium. The term “n-type dopant” refers to an impurity that when added to an intrinsic semiconductor material contributes free electrons to the intrinsic semiconductor material. In a silicon-containing material, examples of n-type dopants include, but are not limited to, antimony, arsenic or phosphorus.

Figure 9:
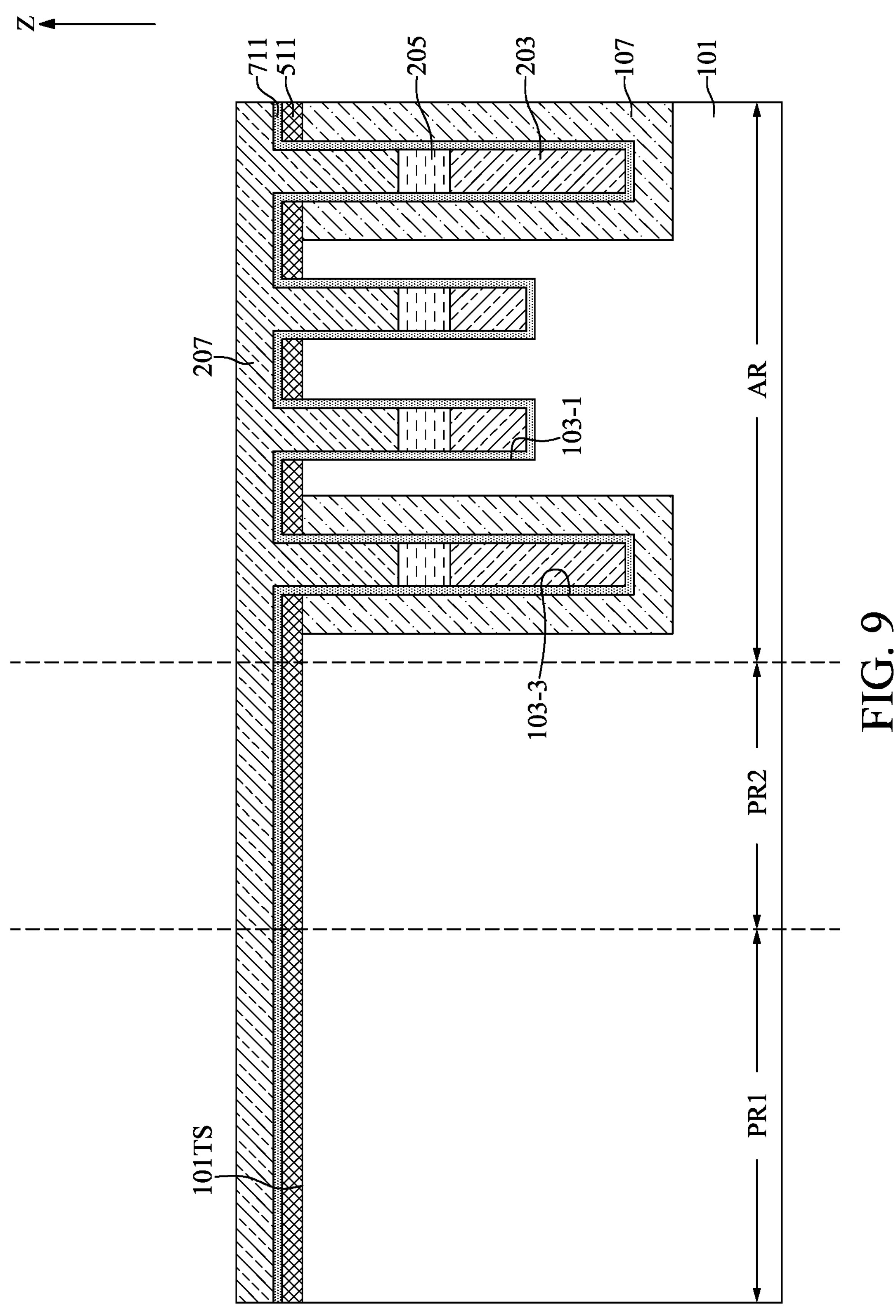

With reference to FIG. 9, the word line capping layer 207 may be formed on the first hard mask layer 511 to completely fill the plurality of word line trenches 103-1, 103-3. In some embodiments, the word line capping layer 207 may be formed of, for example, silicon nitride, silicon oxynitride, silicon nitride oxide, or other applicable dielectric material. In some embodiments, the word line capping layer 207 may be formed by, for example, chemical vapor deposition, plasma-enhanced chemical vapor deposition, or other applicable deposition processes. A planarization process, such as chemical mechanical polishing, may be performed to remove excess material and provide a substantially flat surface for subsequent processing steps.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1 and FIGS. 10 to 13, at step S13, a mandrel layer 723 may be formed on the word line capping layer 207 and above the first peripheral region PR1, a plurality of sacrificial spacers 515 may be formed on sides 723S of the mandrel layer 723, and an under layer 531 may be formed on the word line capping layer 207.

Figure 10:
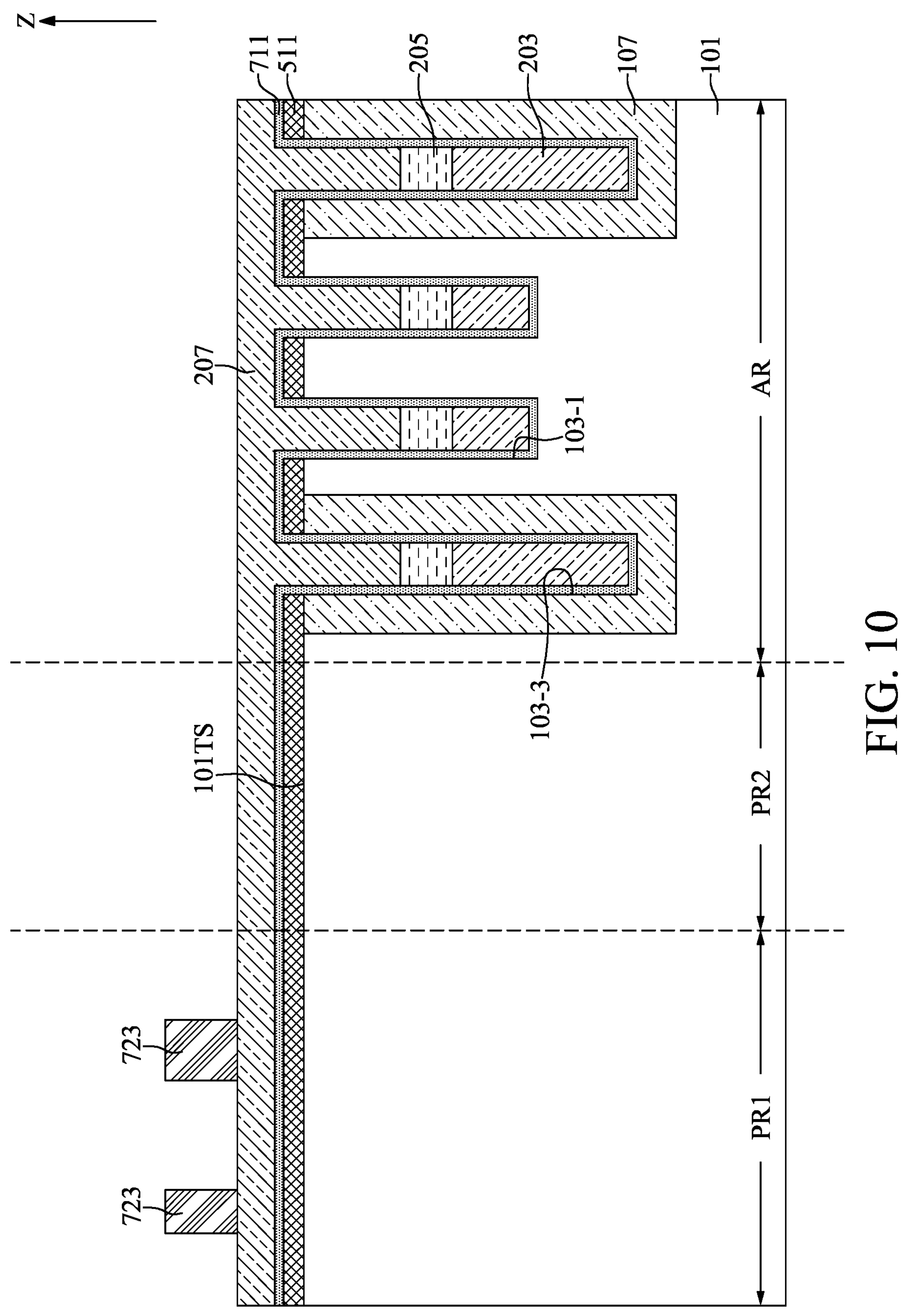

With reference to FIG. 10, the mandrel layer 723 may be formed on the word line capping layer 207 and above the first peripheral region PR1. In some embodiments, the mandrel layer 723 may be a photoresist layer. The mandrel layer 723, which may be a photoresist layer in some embodiments, features a pattern of multiple gate recesses GR (to be illustrated later). This layer may be composed of several segments, which could either have different widths or be of substantially the same width, depending on the specific embodiment. Similarly, the distance between adjacent segment pairs may be either consistently the same or varied.

Figure 11:
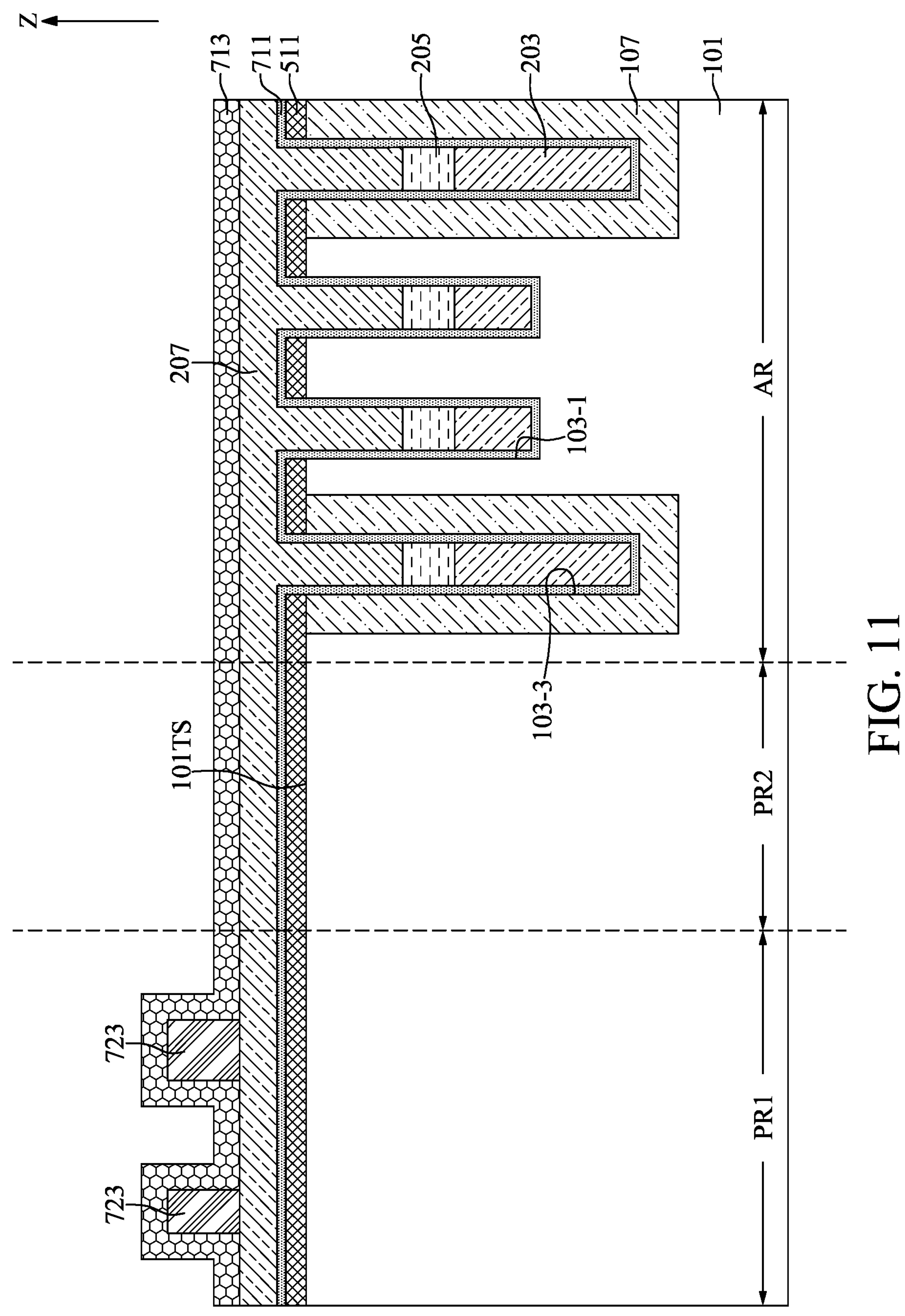

With reference to FIG. 11, a layer of spacer material 713 may be conformally formed on the word line capping layer 207 and may cover the mandrel layer 723. In some embodiments, the spacer material 713 may be, for example, silicon oxide. In some embodiments, the layer of spacer material 713 may be formed by, for example, a deposition process such as an atomic layer deposition process. Generally, the atomic layer deposition process may alternately supply two (or more) different source gases one by one onto a process object (i.e., the word line capping layer 207) under predetermined process conditions, so that chemical species are adsorbed to the process object at a single atomic layer level and are deposited on the process object through surface reactions. For instance, first and second source gases are alternately supplied to a process object to flow along the surface thereof, thereby molecules contained in the first source gas adsorb to the surface, and molecules contained in the second source gas react with the adsorbed molecules originated from the first source gas to form a film of a thickness of a single molecule level. The above process steps are performed repeatedly, so that a high-quality film may be formed on the process object.

In some embodiments, the layer of spacer material 713 formed by the atomic layer deposition process may be conducted at temperatures from about 320° C. to about 530° C. by sequentially exposing the word line capping layer 207 to a gaseous, silicon-containing precursor, such as tetrachlorsilane, and an oxygen-containing precursor, such as water. In some embodiments, forming the layer of spacer material 713 may include exposing the intermediate semiconductor device illustrated in FIG. 10, which is located in a reaction chamber, to the silicon-containing precursor to accomplish chemisorption of silicon species onto the intermediate semiconductor device. Theoretically, the chemisorption forms a silicon-containing monolayer that is uniformly one atom or molecule thick on the entire, exposed substrate. Excess silicon-containing precursor is purged from the reaction chamber and the intermediate semiconductor device may be exposed to the oxygen-containing precursor. The oxygen-containing precursor chemisorbs onto the silicon-containing monolayer, forming an oxygen-containing monolayer. Excess oxygen-containing precursor is then purged from the reaction chamber. These acts are repeated to form silicon dioxide having a desired thickness. The silicon- and oxygen-containing precursors may be mixed with a catalyst, such as pyridine, to speed up deposition while decreasing the reaction temperature in a range of from about 50° C. to about 100° C. Depositing the layer of spacer material 713 at low temperatures may be advantageous in several circumstances due to the thermally sensitive nature of substrates or materials deposited thereon.

Detailedly, in a first reaction of the atomic layer deposition process, the silicon-containing precursor may be introduced to the reaction chamber with pyridine and may chemisorb to the substrate surface. In some embodiments, the silicon-containing precursor may include a silicon hydride or silane, such as hexachlorodisilane, dichlorosilane, silane, disilane, trichiorosilane, or any other silicon-containing compound suitable for use as a precursor. The silicon-containing precursor supplied in this phase may be selected such that the amount of silicon-containing precursor that can be bound to the substrate surface is determined by the number of available binding sites and by the physical size of the chemisorbed species (including ligands). The chemisorbed silicon-containing monolayer formed by the silicon-containing precursor is self-terminated with a surface that is non-reactive with the remaining chemistry used to form the silicon-containing monolayer.

Subsequent pulsing with an inert gas may remove excess silicon-containing precursor from the reaction chamber, especially the silicon-containing precursor that has not chemisorbed to the substrate surface. The inert gas may be nitrogen, argon, helium, neon, krypton, or xenon. Purging the reaction chamber may also remove volatile by-products produced during the atomic layer deposition process. In some embodiments, the inert gas may be nitrogen. The inert gas may be introduced into the reaction chamber, for example, for about 10 seconds. After purging, the reaction chamber may be evacuated or "pumped" to remove gases, such as excess silicon-containing precursor or volatile by-products. For example, the silicon-containing precursor may be purged from the reaction chamber by techniques including, but not limited to, contacting the substrate and/or silicon-containing monolayer with the inert gas and/or lowering the pressure in the reaction chamber to below the deposition pressure of the silicon-containing precursor to reduce the concentration of the silicon-containing precursor contacting the substrate and/or chemisorbed species. Additionally, purging may include contacting the silicon-containing monolayer with any substance that allows chemisorption by-products to desorb and reduces the concentration of the silicon-containing precursor before introducing the oxygen-containing precursor. A suitable amount of purging to remove the silicon-containing precursor and the volatile by-products can be determined experimentally. The pump and purge sequences may be repeated multiple times. The pump and purge sequences may start or end with either the pump or purge act. The time and parameters, such as gas flow, pressure and temperature, during the pump and purge acts may be altered during the pump and purge sequence. The reduction of purging and/or pumping time may increase the amount of silicon oxide that is deposited per minute (Å/minute) and may lead to an increase in the growth rate of layer of spacer material 713.

The second reaction of the atomic layer deposition process may introduce the oxygen-containing precursor and pyridine into the reaction chamber to form an oxygen-containing monolayer over the silicon-containing monolayer. The oxygen-containing monolayer and the silicon-containing monolayer react to form the silicon oxide film (i.e., the layer of spacer material 713). Reaction by-products and excess oxygen-containing precursor may be removed from the reaction chamber by using the pump and purge sequence as described above. For example, a purge may be performed by introducing the inert gas into the reaction chamber. Generally, precursor pulse times range from about 0.5 second to about 30 seconds. The layer of spacer material 713 may be deposited on the word line capping layer 207 through successive or repetitive cycles, where each cycle deposits a monolayer of silicon oxide. The thickness of the layer of spacer material 713 may be achieved by exposing the intermediate semiconductor device to multiple, repetitious cycles.

In some embodiments, after conducting the atomic layer deposition process to form the layer of spacer material 713 but before removing the intermediate semiconductor device from the reaction chamber, the intermediate semiconductor device may be subjected to post-deposition processing, which produces a silicon oxide surface that is substantially free of defects. Therefore, as used herein, the term "post-deposition processing" or grammatical equivalents thereof; means and includes processes conducted after the atomic layer deposition process, such as after the formation of the layer of spacer material 713 is substantially complete.

Detailedly, for one example, after forming the layer of spacer material 713, the intermediate semiconductor device may be subjected to post-deposition processing such that the surface of the layer of spacer material 713 may be substantially free of defects. The post-deposition processing may include, for example, at least one of a pump/purge cycle and water exposure and may be performed after completion of the atomic layer deposition process. As used herein, the term "water exposure" means and includes subjecting intermediate semiconductor device to water. By way of non-limiting example, the water may be deionized water or reagent grade water. The water may come into contact with, or may react with, the layer of spacer material 713 or, alternatively, with gaseous by-products formed during the atomic layer deposition process. In some embodiments, the post-deposition processing may include a pump/purge cycle and water exposure. For example, the post-deposition processing may include at least one pump act, at least one water exposure act, and at least one purge act that may be performed in the reaction chamber after formation of the layer of spacer material 713.

The purge act may include the introduction of an inert gas into the reaction chamber. For example, nitrogen may be pulsed into the reaction chamber for from about 5 seconds to about 60 seconds. However, other inert gases may be used, such as Ar, He, Ne, Kr, and Xe, and combinations thereof. The temperature and flow rate of the inert gas may be adjusted during the purge act of the post-deposition processing to control the formation of defects on the surface of the layer of spacer material 713. The temperature of the inert gas introduced into the reaction chamber may be in a range of from about 50° C. to about 200° C. or in a range of from about 75° C. to about 150° C. As a non-limiting example, the temperature of the inert gas may be maintained at greater than about 75° C. using a container, such as an ampoule, or a heated delivery line or in-line heater used to feed the inert gas into the reaction chamber. The increased temperature of the inert gas during the post-deposition processing may substantially reduce defect formation, possibly due to better removal of by-products from the reaction chamber. To further decrease defect growth on the layer of spacer material 713, the inert gas may be introduced into the reaction chamber at a flow rate of greater than about 0.5 slm. The flow rate may be dependent on the type of reaction chamber used, as well as the size and number of holes in the reaction chamber through which the inert gas may pass. By way of non-limiting example, the inert gas may be introduced into the reaction chamber at a flow rate in a range of from about 0.5 slm to about 100 slm.

As a non-limiting example, the post-deposition processing may include the pump act, a water exposure act, a pump act, and a purge act performed sequentially. However, the acts may be performed any number of times. The water introduced into the reaction chamber during the post-deposition processing may contact or react with the layer of spacer material 713. Additionally, the post-deposition processing may remove unreacted gases and by-products from the reaction chamber.

The post-deposition processing may be repeated to achieve the surface of the layer of spacer material 713 substantially free of defects. As a non-limiting example, the post-deposition processing may be repeated from one time to ten times. The total time for one post-deposition processing may be in a range of from about 0.5 minute to about 6 minutes.

The conditions in the reaction chamber during the post-deposition processing may be controlled to further reduce the formation of defects on the layer of spacer material 713. For example, the temperature of the reaction chamber may be controlled to reduce the formation of defects on the layer of spacer material 713. By way of non-limiting example, during the post-deposition processing, the temperature (i.e., the process temperature of post-deposition processing) within the reaction chamber may be increased by from about 10° C. to about 50° C. relative to the temperature of the reaction chamber during the deposition of the layer of spacer material 713. During the post-deposition processing, the temperature within the reaction chamber may be at a non-steady state but above the temperature (i.e., the process temperature of forming the layer of spacer material 713) of the reaction chamber during the deposition of the layer of spacer material 713.

Alternatively, in other embodiments, the post-deposition processing may include a pump/purge cycle following formation of the layer of spacer material 713 to reduce the formation of defects. The pump/purge cycle may only include pump act and purge act. As a non-limiting example, the pump/purge cycle may employ the inert gas to remove volatile materials from the reaction chamber in purge act. For example, the pump/purge cycle may include a pump act to at least partially remove gases contained in the reaction chamber, followed by a purge act to introduce the inert gas into the reaction chamber. The pump act may include at least partially removing surplus precursor gases, catalyst, inert gas, and by-products from the reaction chamber. The reaction chamber may be evacuated for an amount of time in a range of from about 5 seconds to about 60 seconds. The purge act may include introducing an inert gas into the reaction chamber for a time in a range of about 5 seconds to about 60 seconds. During the purge act, the inert gas may be introduced into the reaction chamber at a temperature of greater than about 50° C. or at a temperature in the range extending from about 75° C. to about 150° C. By way of non-limiting example, the inert gas may be nitrogen and may be stored in an ampoule or passed through a delivery line maintained at a temperature of about 150° C. The inert gas may be introduced into the reaction chamber at a flow rate of greater than about 0.5 slm or about 30 slm. The pump/purge cycle may include more than one pump act and purge act. If multiple pump acts and purge acts are used, each of the pump acts and purge acts may be different from one another. Additionally, the conditions during each of the pump acts and purge acts, such as time, temperature, and flow rate, may be varied during the pump/purge cycle. The pump/purge cycle may be repeated in succession to substantially remove by-products from the reaction chamber. Generally, increasing pump/purge cycle times during post-deposition processing may further reduce the formation of crystal growth following deposition of layer of spacer material 713.

By way of a non-limiting example, the pump/purge cycle may include a pump act of 60 seconds to remove volatile gases and a purge act of 60 seconds by introducing the inert gas for 60 seconds. As another example, the pump/purge cycle may include a pump act of 30 seconds and a purge act of 30 seconds. The purge act may include pulsing the inert gas into the reaction chamber at a flow rate of greater than about 0.5 slm. Thus, if the pump/purge cycle is repeated twice in succession, the total time for the pump/purge cycle may be in a range of from about 2 to 4 minutes. As a non-limiting example, the pump/purge cycle may be repeated in succession from one to eight times. Additionally, the other post-deposition acts, such as a water exposure, may be performed between cycles of the pump/purge cycle.

During the pump/purge cycle, the temperature of the reaction chamber may be controlled or maintained at a temperature in a range extending from about 5° C. to about 50° C. above the deposition temperature, as previously described. By way of non-limiting example, if the formation of the layer of spacer material 713 is performed at a temperature of about 75° C., the reaction chamber may be heated to a temperature in a range of from about 85° C. to about 125° C. or in a range of from about 90° C. to about 100° C. to reduce the formation of defects on the layer of spacer material 713 during the post-deposition processing. During some part of the pump/purge cycle, the temperature of the reaction chamber may also be in a non-steady state, however, at a temperature above the deposition temperature. For example, the temperature within the reaction chamber may be increased to a desired temperature for post-deposition processing during the pump/purge cycle. However, the temperature within the reaction chamber may not reach the desired temperature for a time of from about 5 minutes to about 10 minutes after post-deposition processing begins. Thus, the reaction chamber temperature is in a non-steady state as the temperature change occurs.

Figure 12:
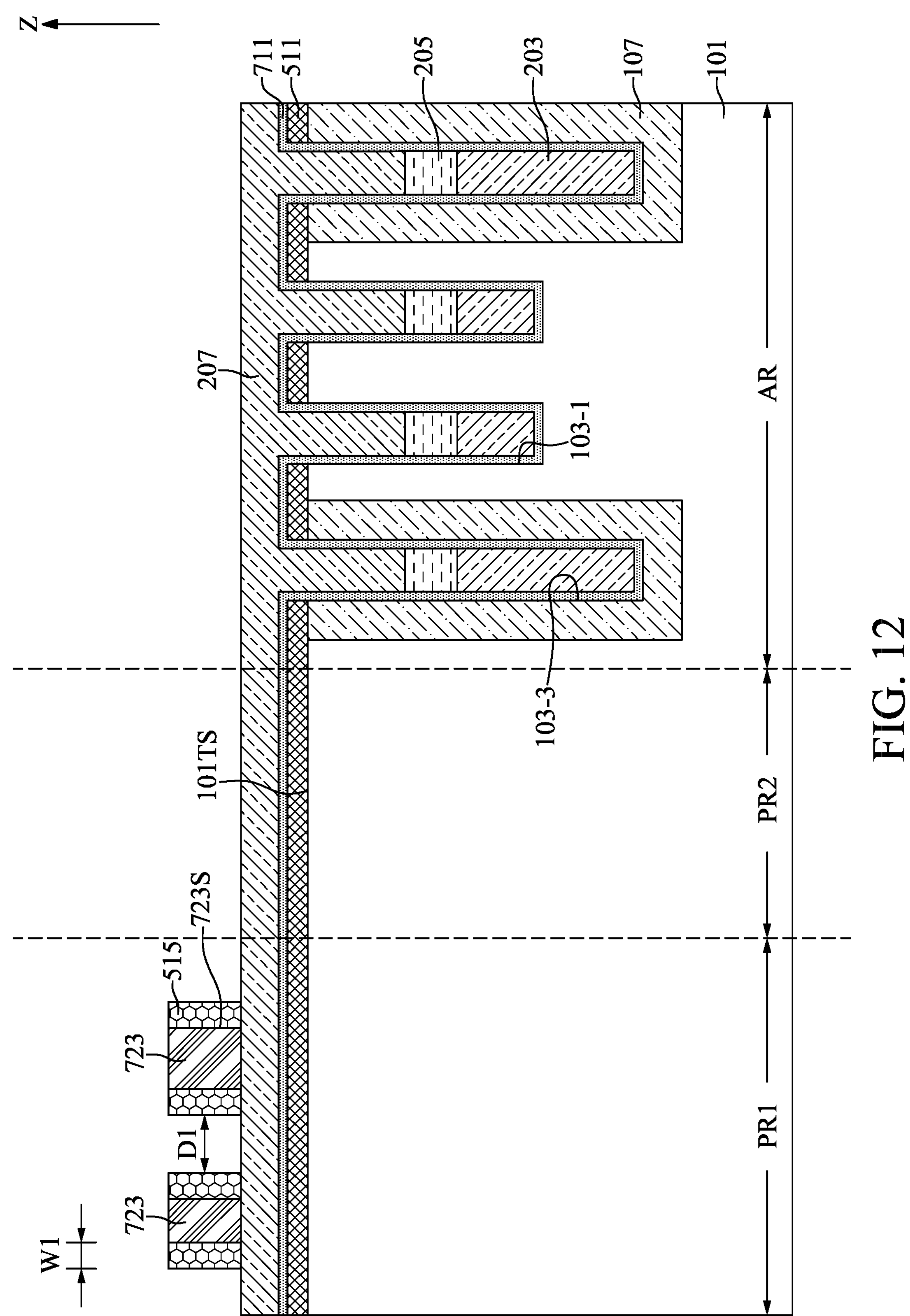

With reference to FIG. 12, a spacer etching process may be performed to remove a portion of the spacer material 713. After the spacer etching process, the remaining spacer material 713 may be referred to as the plurality of sacrificial spacers 515. In some embodiments, the spacer etching process may be an anisotropic etching process such as an anisotropic dry etching process. In some embodiments, the etch rate ratio of the spacer material 713 to the mandrel layer 723 may be between about 100:1 and about 5:1, between about 15:1 and about 5:1, or between about 10:1 and about 5:1 during the spacer etching process. In some embodiments, the etch rate ratio of the spacer material 713 to the word line capping layer 207 may be between about 100:1 and about 5:1, between about 15:1 and about 5:1, or between about 10:1 and about 5:1 during the spacer etching process.

With reference to FIG. 12, the plurality of sacrificial spacers 515 may be formed on the sides (or sidewalls) 723S of the mandrel layer 723. In some embodiments, the widths W1 of the plurality of sacrificial spacers 515 may be substantially the same. In some embodiments, the distances D1 between consecutive sacrificial spacers 515 could be consistent. In some embodiments, the distances D1 between consecutive sacrificial spacers 515 could be different. Notably, adjacent sacrificial spacers 515 may not be positioned against the same segment of the mandrel layer 723.

Figure 13:
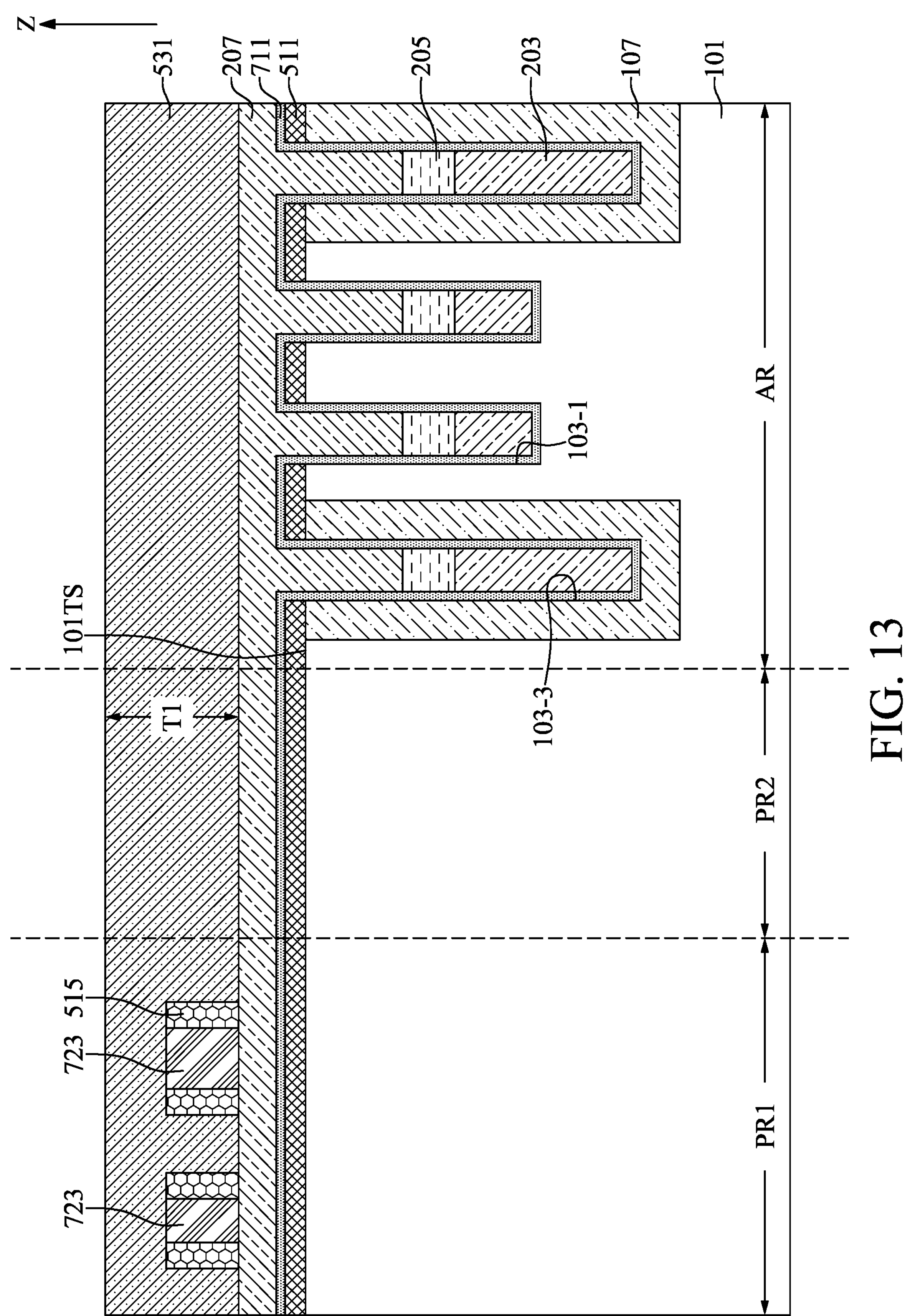

With reference to FIG. 13, the under layer 531 may be formed on the word line capping layer 207 and covering the mandrel layer 723 and the plurality of sacrificial spacers 515. The gaps between consecutive sacrificial spacers 515 may be completely filled by the under layer 531. In some embodiments, a planarization process may be performed to remove excess material and provide a substantially flat surface for subsequent processing steps. In some embodiments, the under layer 531 may include a self-planarizing material such as a spin-on glass or a spin-on low-k dielectric material. The use of a self-planarizing dielectric material may avoid the need to perform a subsequent planarizing step. In some embodiments, the under layer 531 may be configured as an anti-reflective layer. In some embodiments, the under layer 531 may consist of thin film structures with alternating layers of contrasting refractive index. The thickness T1 of the under layer 531 may be chosen to produce destructive interference in the beams reflected from the interfaces, and constructive interference in the corresponding transmitted beams. By way of example, and by no means limiting, the under layer 531 may be formed of, for example, oxides, sulfides, fluorides, nitrides, selenides, or a combination thereof. In some embodiments, the under layer 531 may improve the resolution of the lithography process. In some embodiments, the under layer 531 may be formed by a deposition process including, for example, chemical vapor deposition, plasma enhanced chemical vapor deposition, evaporation, spin-on coating, or other applicable deposition processes.

With reference to FIG. 1 and FIGS. 14 to 20, at step S15, the under layer 531 may be recessed to expose the plurality of sacrificial spacers 515, the plurality of sacrificial spacers 515 may be selectively removed to expose the first peripheral region PR1, and a plurality of gate recesses GR may be formed in the first peripheral region PR1 of the substrate 101.

Figure 14:
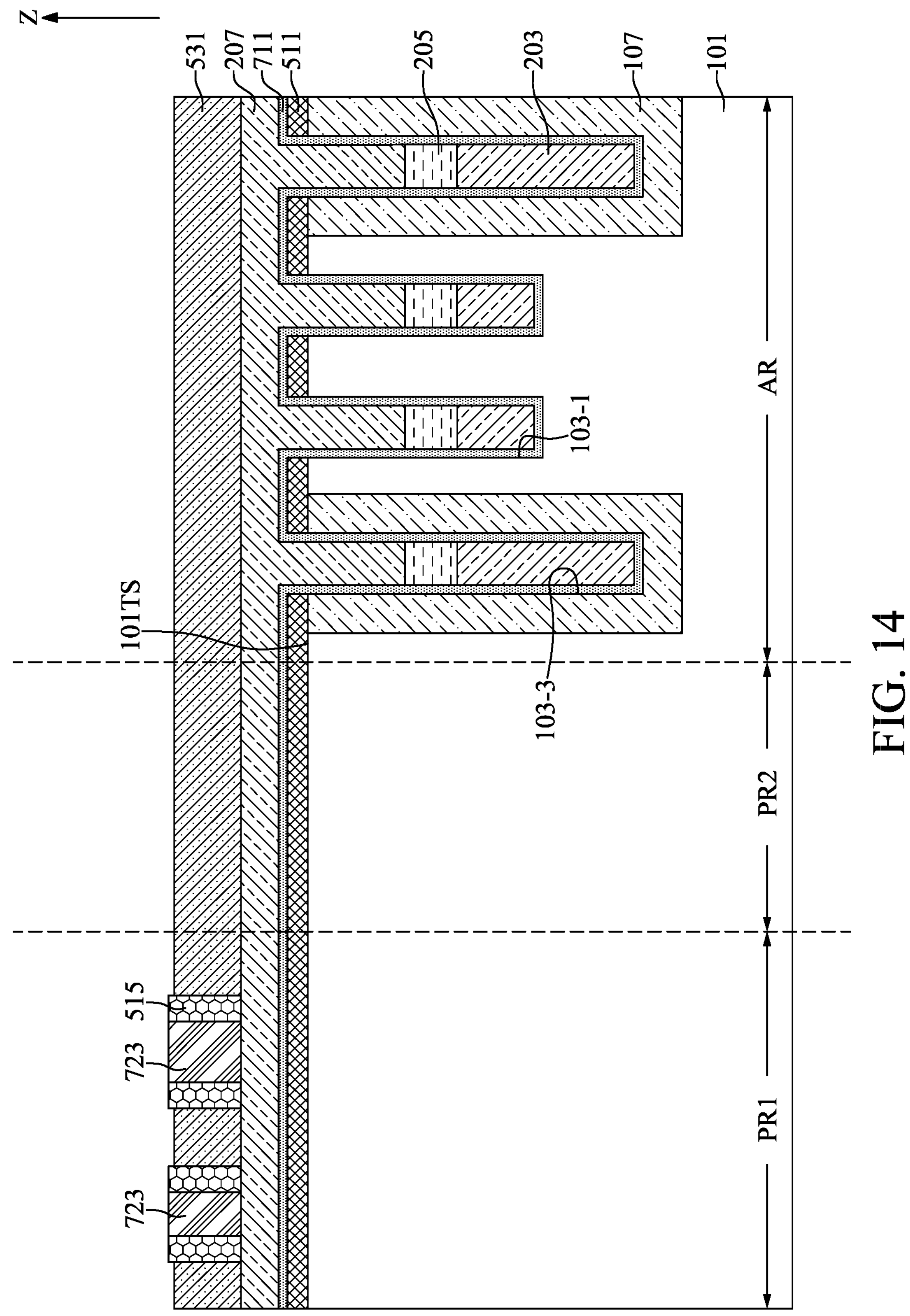

With reference to FIG. 14, a recessing process may be performed to lower the top surface of the under layer 531. In some embodiments, the recessing process may be an etching process having etching selectivity to the under layer 531. In some embodiments, the recessing process may be an isotropic etching process such as wet etching process. In some embodiments, the etch rate ratio of the under layer 531 to the plurality of sacrificial spacers 515 may be between about 100:1 and about 5:1, between about 15:1 and about 5:1, or between about 10:1 and about 5:1 during the recessing process. In some embodiments, the etch rate ratio of the under layer 531 to the mandrel layer 723 may be between about 100:1 and about 5:1, between about 15:1 and about 5:1, or between about 10:1 and about 5:1 during the recessing process. In some embodiments, the end point of the recessing process may be determined by the signal of the plurality of sacrificial spacers 515 and the mandrel layer 723. After the recessing process, the top surfaces of the plurality of sacrificial spacers 515 and the mandrel layer 723 may be exposed.

Figure 15:
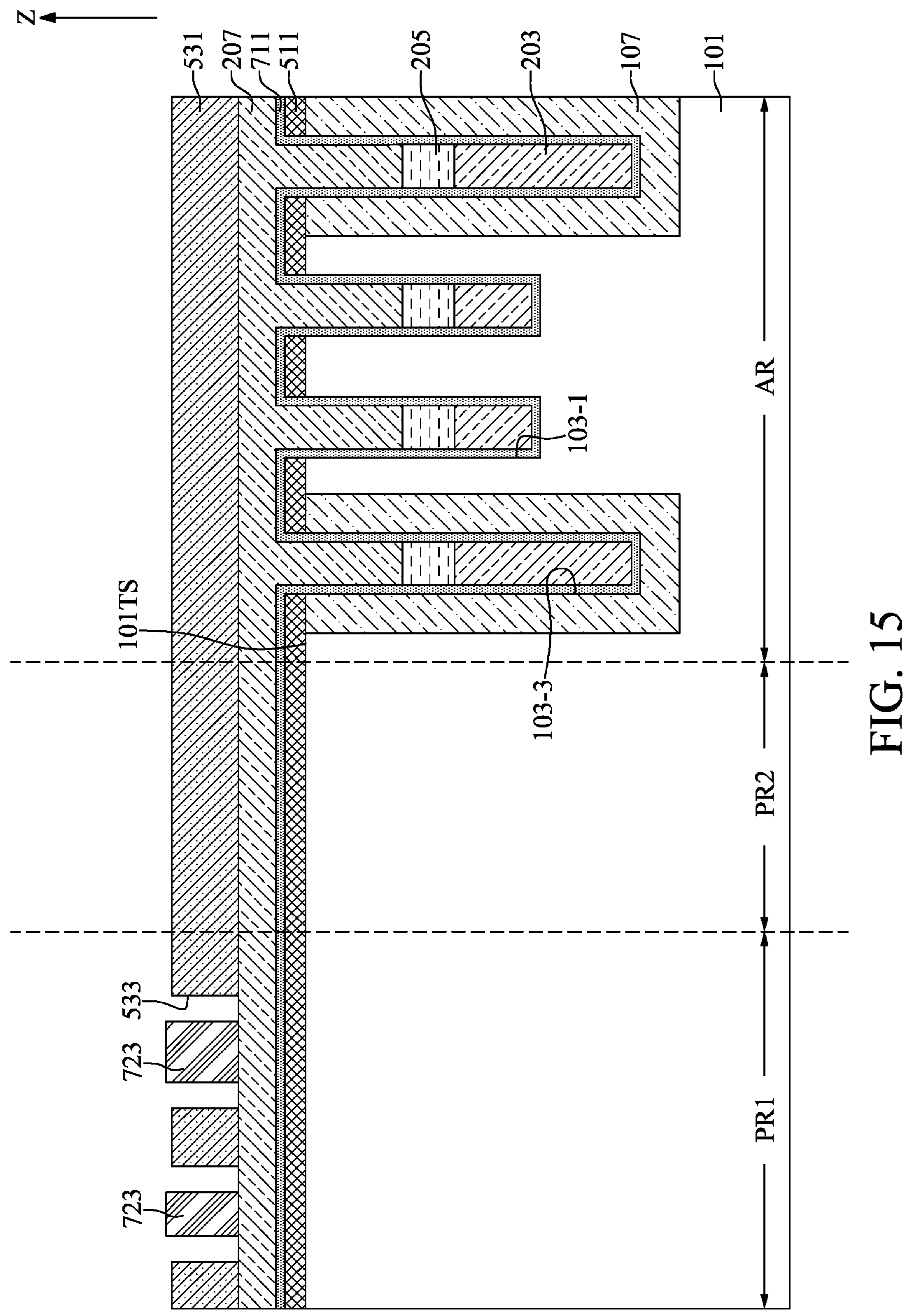

With reference to FIG. 15, a selective removal process may be performed to selectively remove the plurality of sacrificial spacers 515. In some embodiments, the selective removal process may be an etching process having etching selectivity to the plurality of sacrificial spacers 515. In some embodiments, the selective removal process may be an isotropic etching process such as an isotropic wet etching process. In some embodiments, the etch rate ratio of the spacer material 713 to the under layer 531 may be between about 100:1 and about 5:1, between about 15:1 and about 5:1, or between about 10:1 and about 5:1 during the selective removal process. In some embodiments, the etch rate ratio of the spacer material 713 to the mandrel layer 723 may be between about 100:1 and about 5:1, between about 15:1 and about 5:1, or between about 10:1 and about 5:1 during the selective removal process. In some embodiments, the etch rate ratio of the spacer material 713 to the word line capping layer 207 may be between about 100:1 and about 5:1, between about 15:1 and about 5:1, or between about 10:1 and about 5:1 during the selective removal process. After the selective removal process, a plurality of openings 533 may be formed along the under layer 531, adjacent to the mandrel layer 723, and above the first peripheral region PR1 of the substrate 101. The plurality of openings 533 may replace the locations previously occupied by the sacrificial spacers 515. Portions of the word line capping layer 207 may be exposed through the plurality of openings 533.

Figure 16:
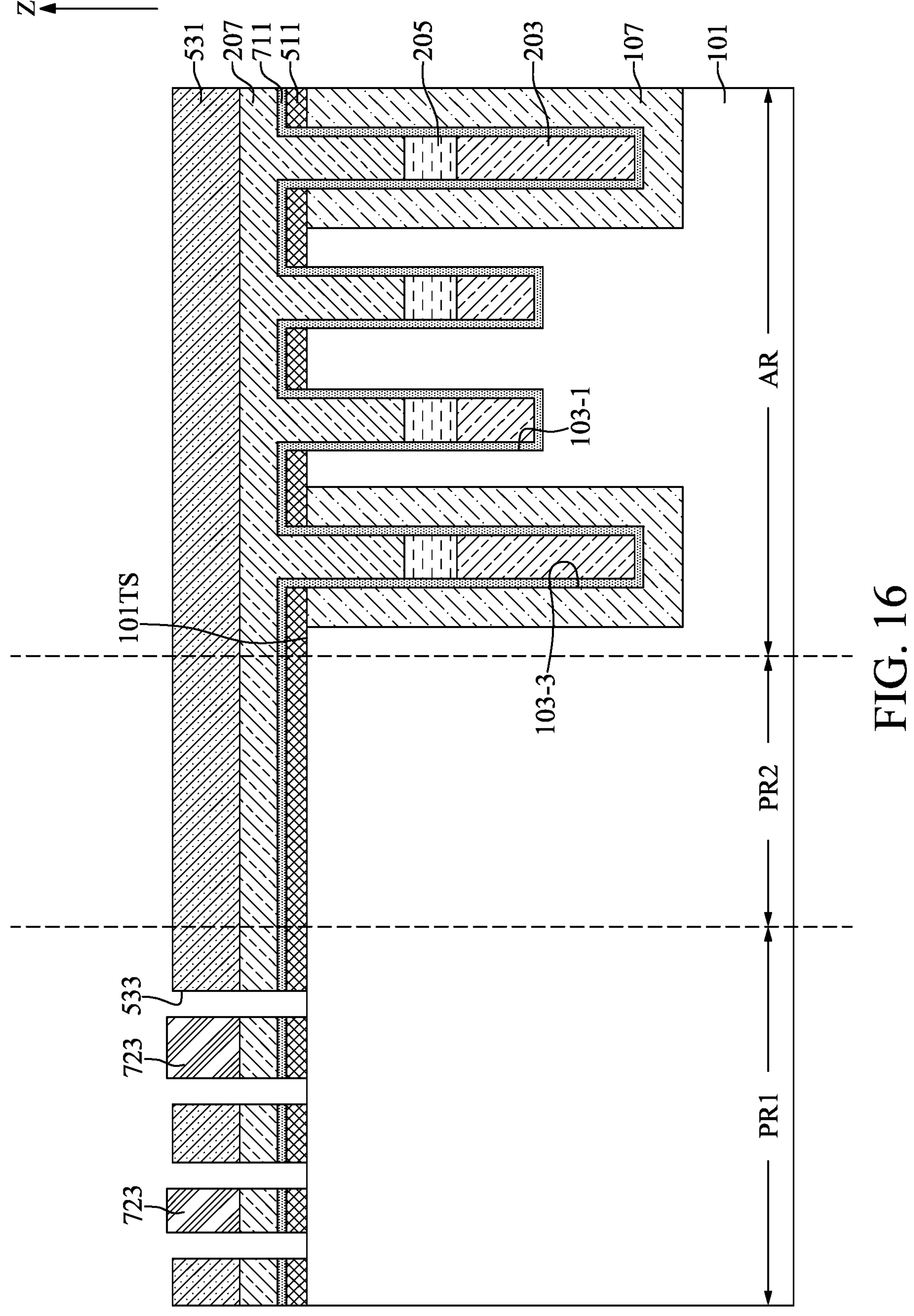

With reference to FIG. 16, an etching process may be performed using the under layer 531 and the mandrel layer 723 as a mask to remove the portions, which are not masked, of the word line capping layer 207, the layer of first insulating material 711, and the first hard mask layer 511. In some embodiments, the etching process may be a multi-stage etching process. For example, the etching process may be a three-stage anisotropic dry etching process. The etching chemistry may be different for each stage to provide different etching selectivity.

In some embodiments, the etch rate ratio of the word line capping layer 207 to the under layer 531 may be between about 100:1 and about 5:1, between about 15:1 and about 5:1, or between about 10:1 and about 5:1 during the first stage of the etching process. In some embodiments, the etch rate ratio of the word line capping layer 207 to the mandrel layer 723 may be between about 100:1 and about 5:1, between about 15:1 and about 5:1, or between about 10:1 and about 5:1 during the first stage of the etching process.

In some embodiments, the etch rate ratio of the first insulating material 711 to the under layer 531 may be between about 100:1 and about 5:1, between about 15:1 and about 5:1, or between about 10:1 and about 5:1 during the second stage of the etching process. In some embodiments, the etch rate ratio of the first insulating material 711 to the mandrel layer 723 may be between about 100:1 and about 5:1, between about 15:1 and about 5:1, or between about 10:1 and about 5:1 during the second stage of the etching process.

In some embodiments, the etch rate ratio of the first hard mask layer 511 to the under layer 531 may be between about 100:1 and about 5:1, between about 15:1 and about 5:1, or between about 10:1 and about 5:1 during the third stage of the etching process. In some embodiments, the etch rate ratio of the first hard mask layer 511 to the mandrel layer 723 may be between about 100:1 and about 5:1, between about 15:1 and about 5:1, or between about 10:1 and about 5:1 during the third stage of the etching process.

The etching process may enlarge the plurality of openings 533 to the word line capping layer 207, the layer of first insulating material 711, and the first hard mask layer 511, revealing portions of the top surface 101TS of the first peripheral region PR1 of the substrate 101.

Figure 17:
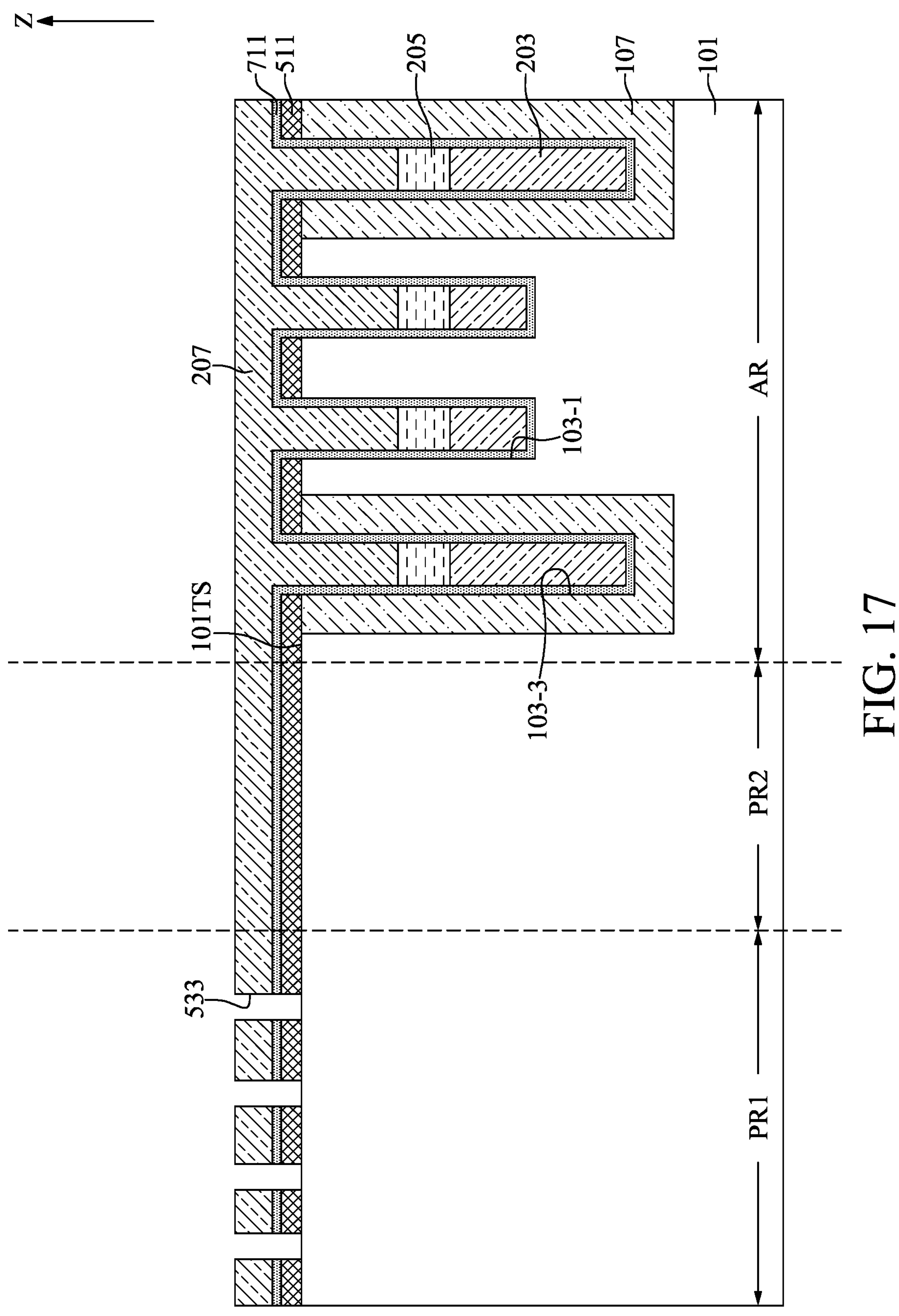

With reference to FIG. 17, the under layer 531 and the mandrel layer 723 may be removed by a removal process. In some embodiments, the removal process may be an etching process having etching selectivity to the under layer 531 or the mandrel layer 723. For example, the removal process may be an isotropic wet etching process. In some embodiments, the removal process may be an ashing process.

Figure 18:
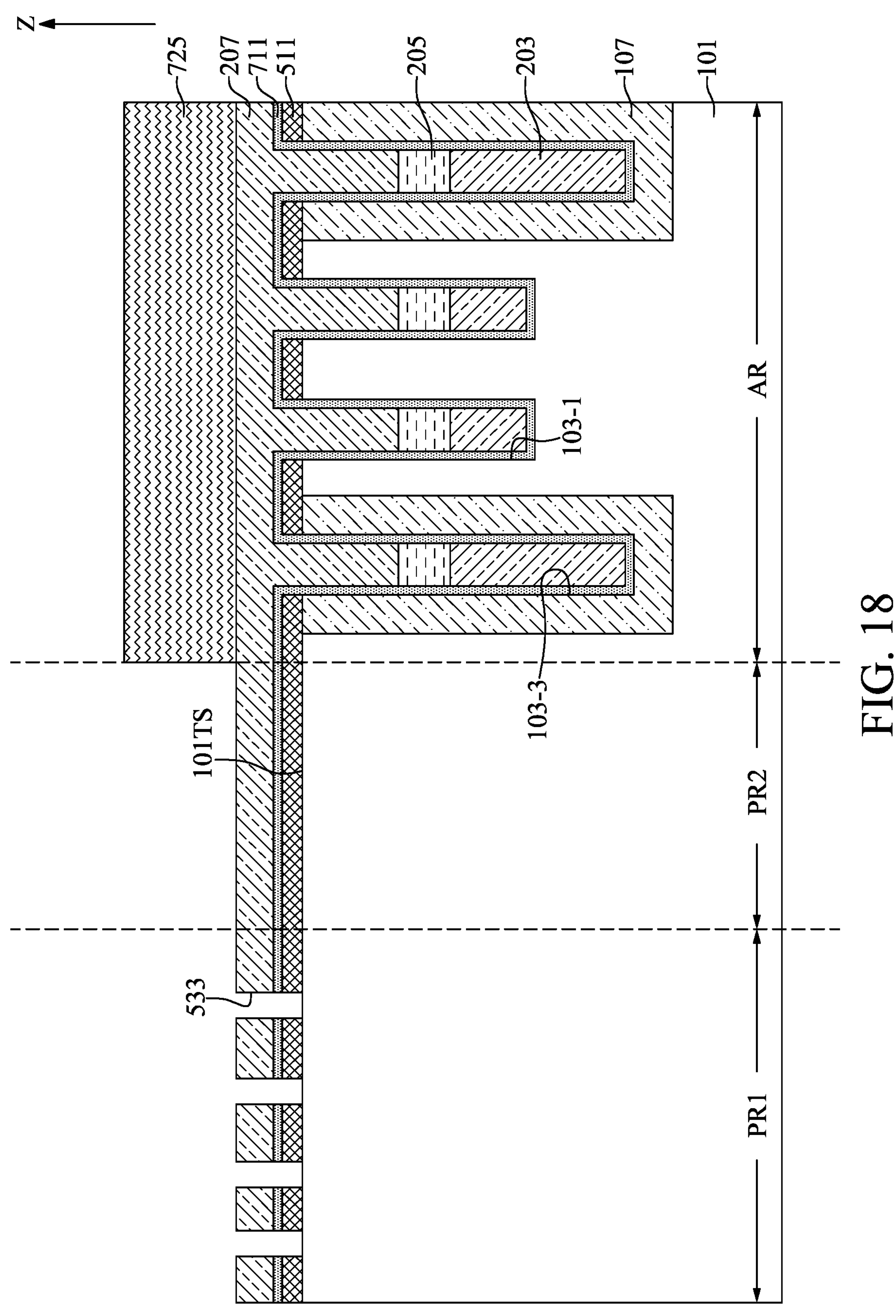

With reference to FIG. 18, a second mask layer 725 may be formed on the word line capping layer 207 and above the array region AR of the substrate 101. In some embodiments, the second mask layer 725 may be a photoresist layer. The second mask layer 725 may mask the array region AR of the substrate 101.

Figure 19:
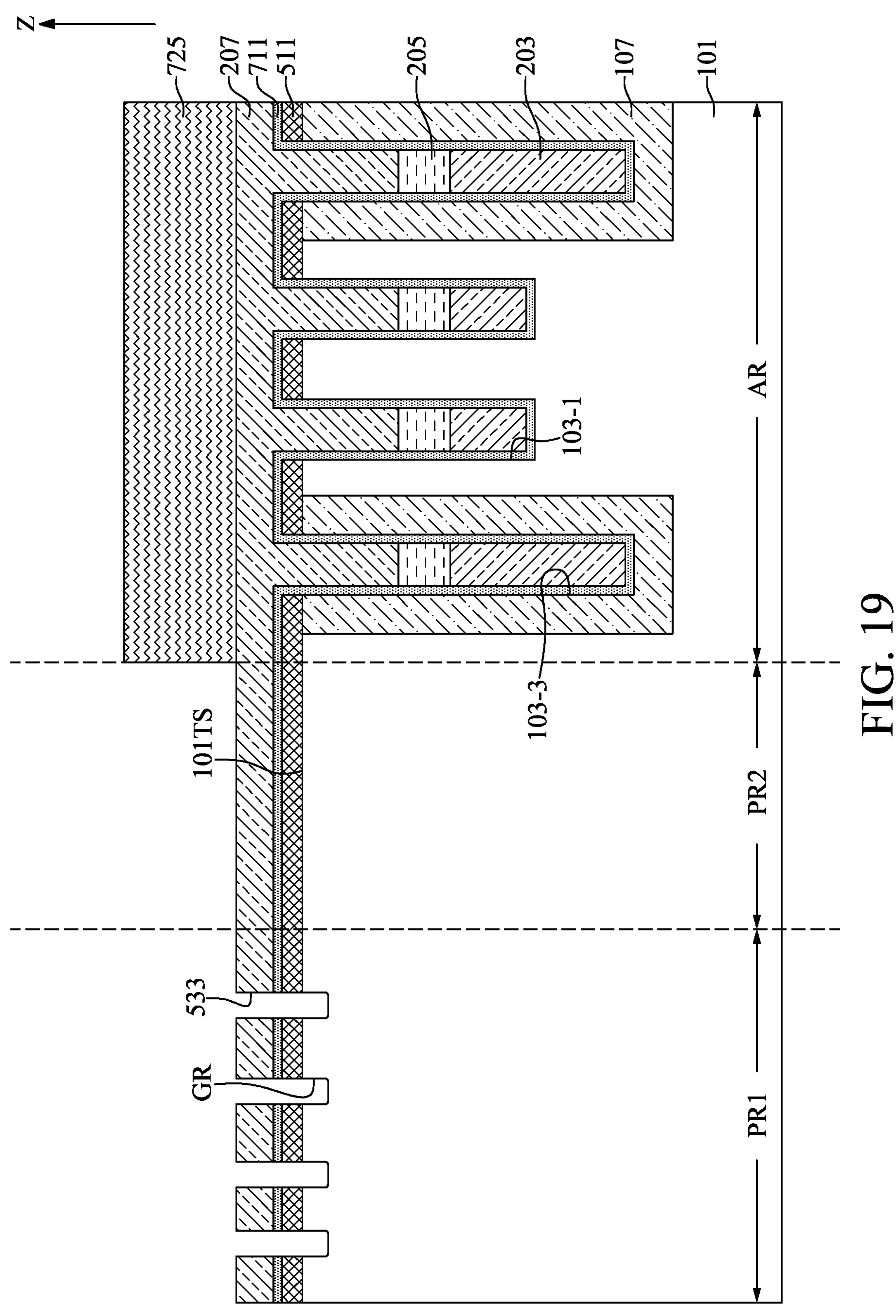

With reference to FIG. 19, a gate-recess etching process may be performed to remove portions of the first peripheral region PR1 of the substrate 101. In some embodiments, the gate-recess etching process may be an anisotropic etching process having etching selectivity to the substrate 101. For example, the gate-recess etching process may be an anisotropic dry etching process. In some embodiments, the etch rate ratio of the substrate 101 to the word line capping layer 207 (the first insulating material 711, or the first hard mask layer 511) may be between about 100:1 and about 5:1, between about 15:1 and about 5:1, or between about 10:1 and about 5:1 during the gate-recess etching process. After the gate-recess etching process, the plurality of gate recesses GR may be formed in the first peripheral region PR1 of the substrate 101.

Figure 20:
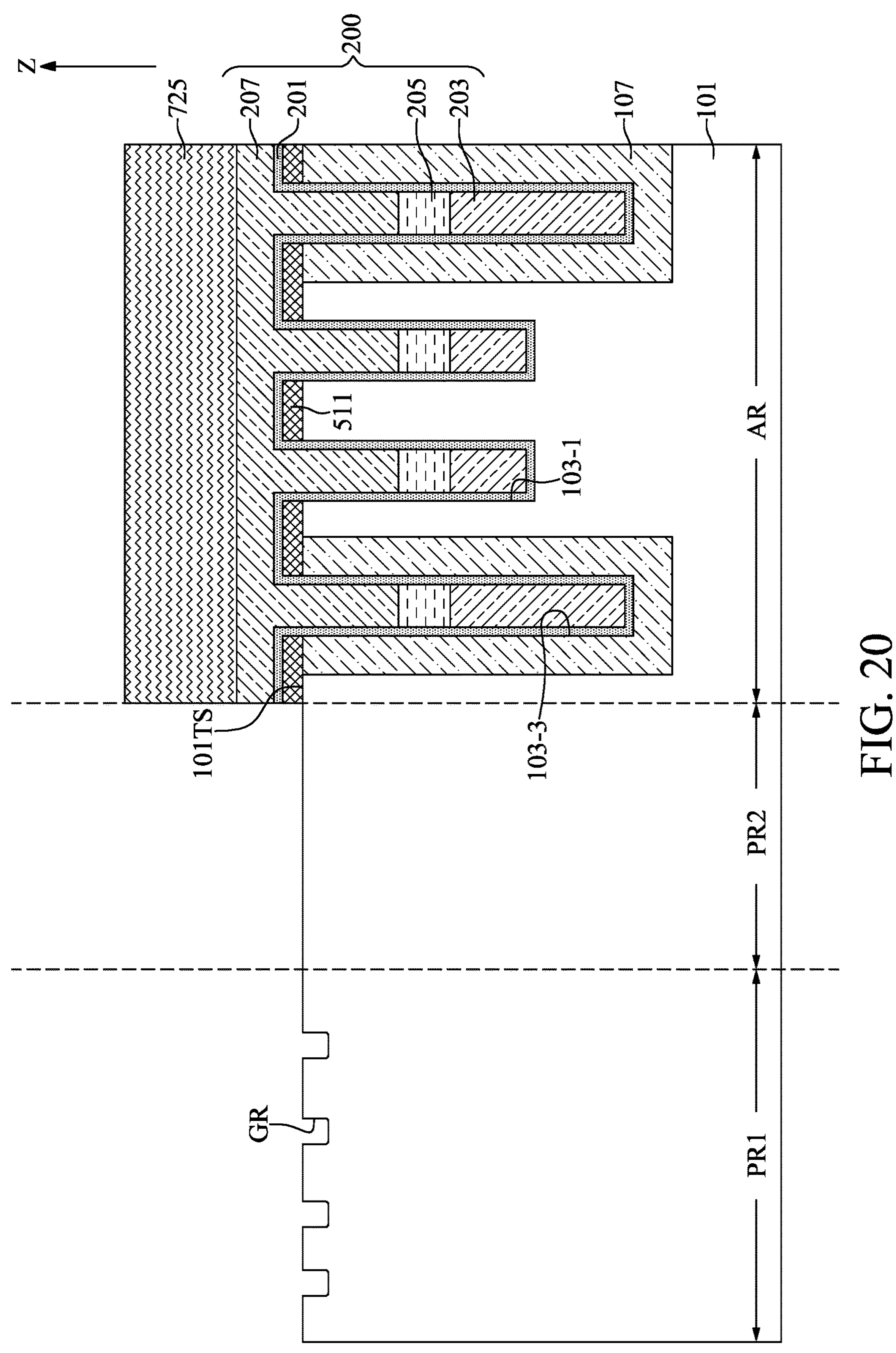

With reference to FIG. 20, an etching process may be performed using the second mask layer 725 as a mask to remove the portions, which are not masked by the second mask layer 725 (i.e., the first peripheral region PR1 and the second peripheral region PR2), of the word line capping layer 207, the layer of first insulating material 711, and the first hard mask layer 511. After the etching process, the remaining first insulating material 711 may be referred to as the word line dielectric layer 201. The word line dielectric layer 201, the plurality of word line bottom conductive layers 203, the plurality of word line top conductive layers 205, and the word line capping layer 207 together configure the plurality of word line structures 200. After the etching process, the second mask layer 725 may be removed. In some embodiments, the second mask layer 725 may be kept until the formation of gate structures on the first peripheral region PR1 and the second peripheral region PR2, which will be illustrated later.

With reference to FIG. 1 and FIGS. 21 to 27, at step S17, a plurality of recessed gates 400 may be formed on the plurality of gate recesses GR and a peripheral gate structure 300 may be formed on the second peripheral region PR2 of the substrate 101.

Figure 21:
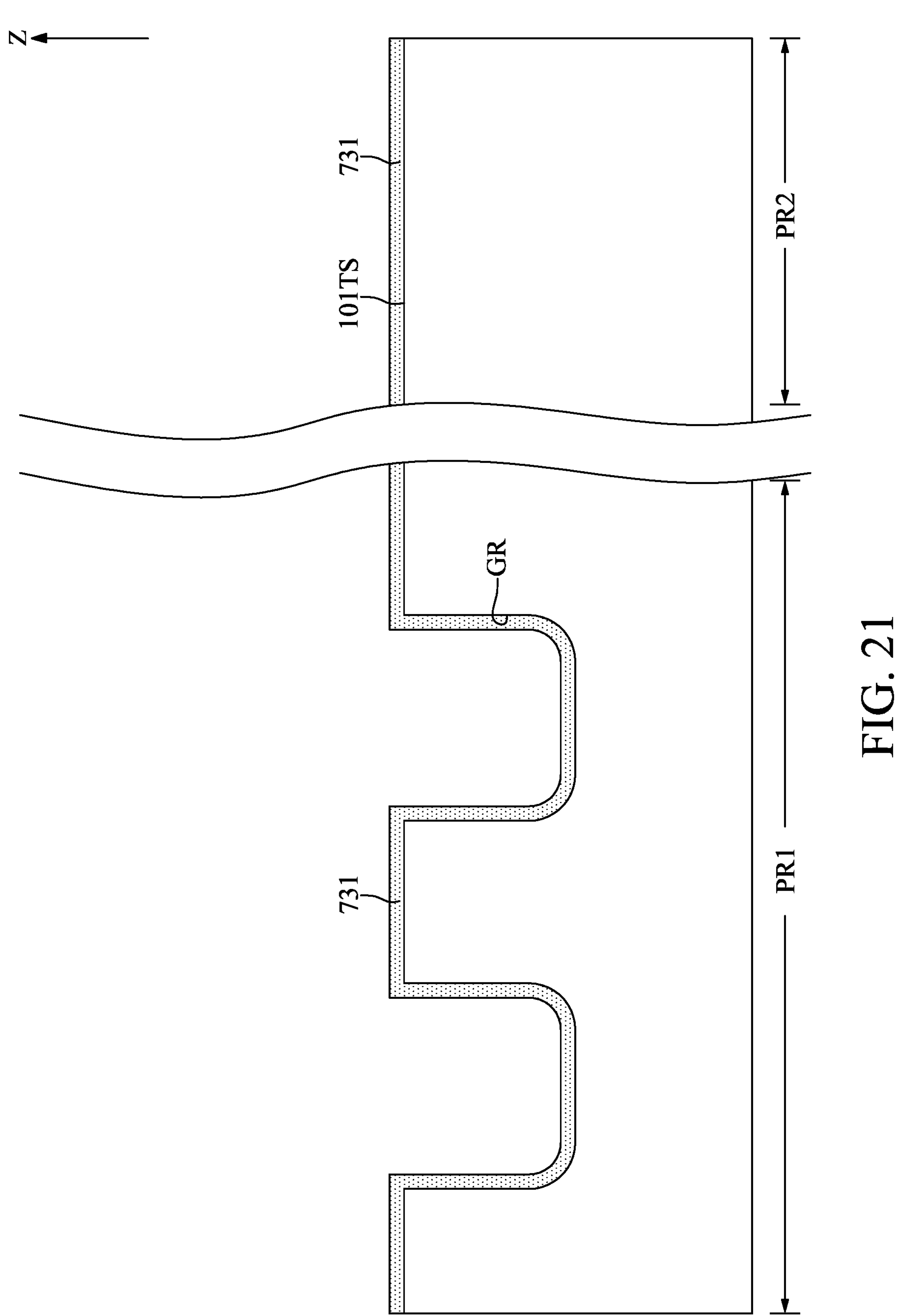

With reference to FIG. 21, a layer of gate dielectric material 731 may be conformally formed on the top surface 101TS of the first peripheral region PR1 and the second peripheral region PR2 of the substrate 101 and on the plurality of gate recesses GR. In some embodiments, the gate dielectric material 731 may include, for example, oxides, nitrides, oxynitrides, silicates (e.g., metal silicates), aluminates, titanates, nitrides, high-k dielectric materials, or a combination thereof. In some embodiments, the layer of gate dielectric material 731 may be formed by suitable deposition processes, for example, atomic layer deposition, chemical vapor deposition, plasma-enhanced chemical vapor deposition, evaporation, chemical solution deposition, or other suitable deposition processes. In some embodiments, the layer of gate dielectric material 731 may be formed by oxidizing the top surface 101TS of the first peripheral region PR1 and the second peripheral region PR2 of the substrate 101 and the plurality of gate recesses GR. In some embodiments, the thickness of the layer of gate dielectric material 731 may be between about 10 angstroms and about 50 angstroms. In some embodiments, the layer of gate dielectric material 731 may include a multi-layered structure. For example, the layer of gate dielectric material 731 may be an oxide-nitride-oxide (ONO) structure. For another example, the layer of gate dielectric material 731 may include a bottom layer formed of silicon oxide and a top layer formed of high-k dielectric materials.

Examples of high-k dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric materials may further include dopants such as, for example, lanthanum and aluminum.

With reference to FIG. 21, the layer of gate dielectric material 731 formed within the plurality of gate recesses GR may include a Valley-shaped, a U-shaped, or a V-shaped cross-sectional profile.

Figure 22:
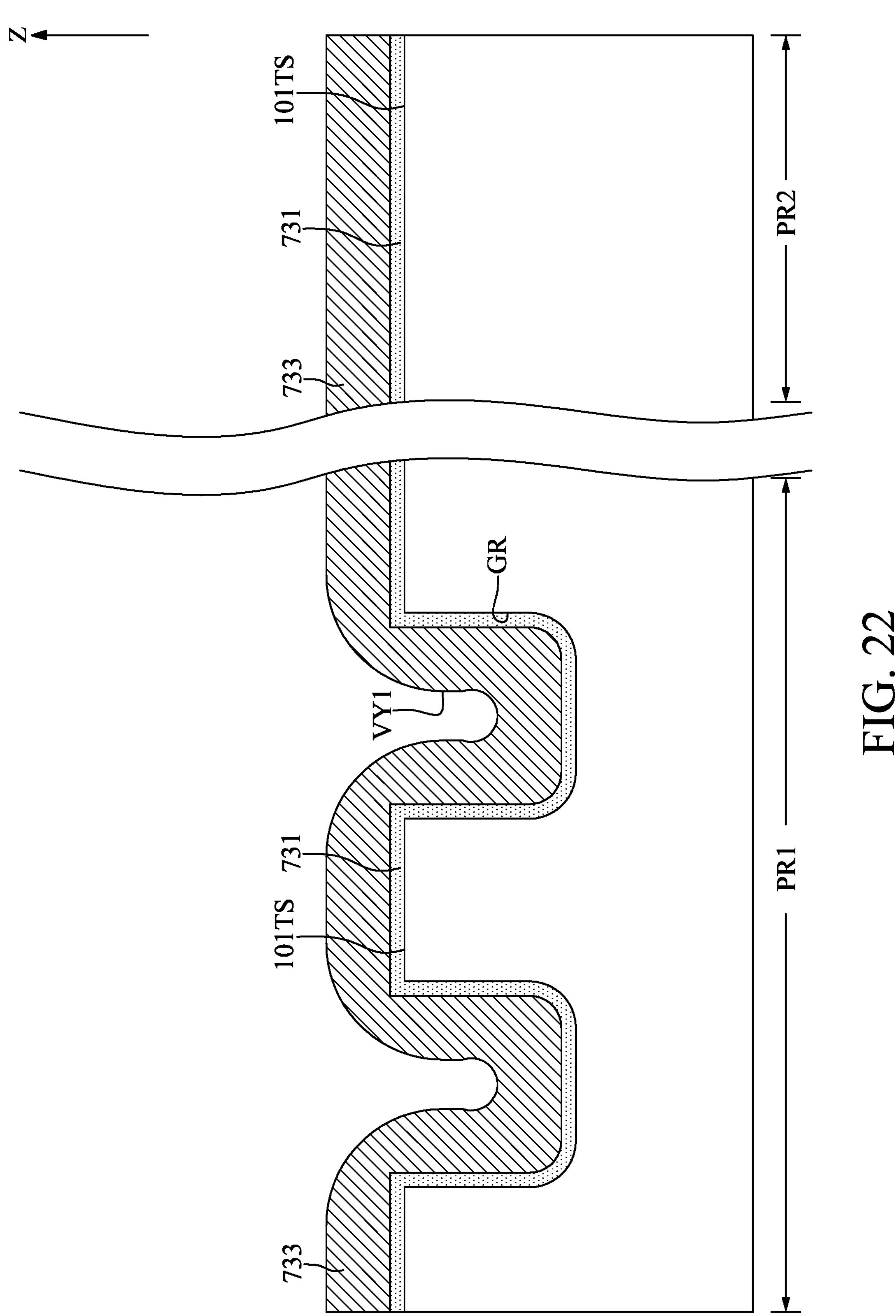

With reference to FIG. 22, a layer of the first conductive material 733 may be conformally formed over the surface of the layer of gate dielectric material 731. When this first conductive material 733 partially fills the plurality of gate recesses GR, it forms upward-facing valleys (referred to as first valleys VY1) within the plurality of gate recesses GR. In some embodiments, the first conductive material 733 may include, for example, polycrystalline silicon, polycrystalline germanium, polycrystalline silicon germanium, doped polycrystalline silicon, doped polycrystalline germanium, doped polycrystalline silicon germanium, or other suitable conductive material. In some embodiments, the layer of first conductive material 733 may be doped with p-type dopants or n-type dopants. In some embodiments, the layer of first conductive material 733 formed within the plurality of gate recesses GR may include a valley-shaped, a U-shaped, or a V-shaped cross-sectional profile.

Figure 23:
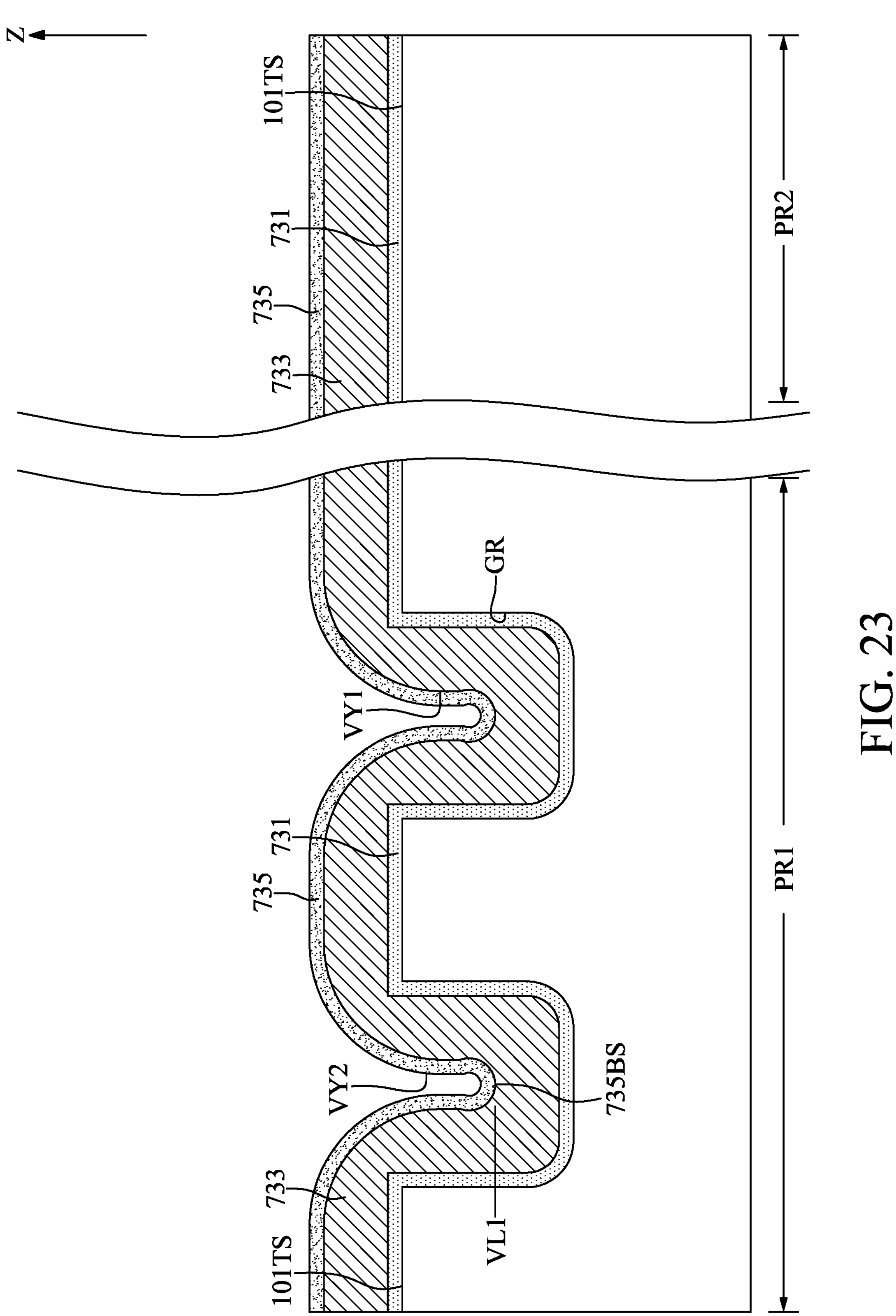

With reference to FIG. 23, a layer of second conductive material 735 may be conformally formed over the surface of the layer of first conductive material 733. When this second conductive material 735 partially fills the first valleys VY1, it forms upward-facing valleys (referred to as second valleys VY2) within the plurality of gate recesses GR. In some embodiments, the second conductive material 735 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the layer of second conductive material 735 formed within the plurality of gate recesses GR may include a valley-shaped, a U-shaped, or a V-shaped cross-sectional profile. In some embodiments, the bottom surface 735BS (or the bottom portion of the second valleys VY2) of the layer of second conductive material 735 may be at a vertical level VL1 lower than the top surface 101TS of the substrate 101.

Figure 24:
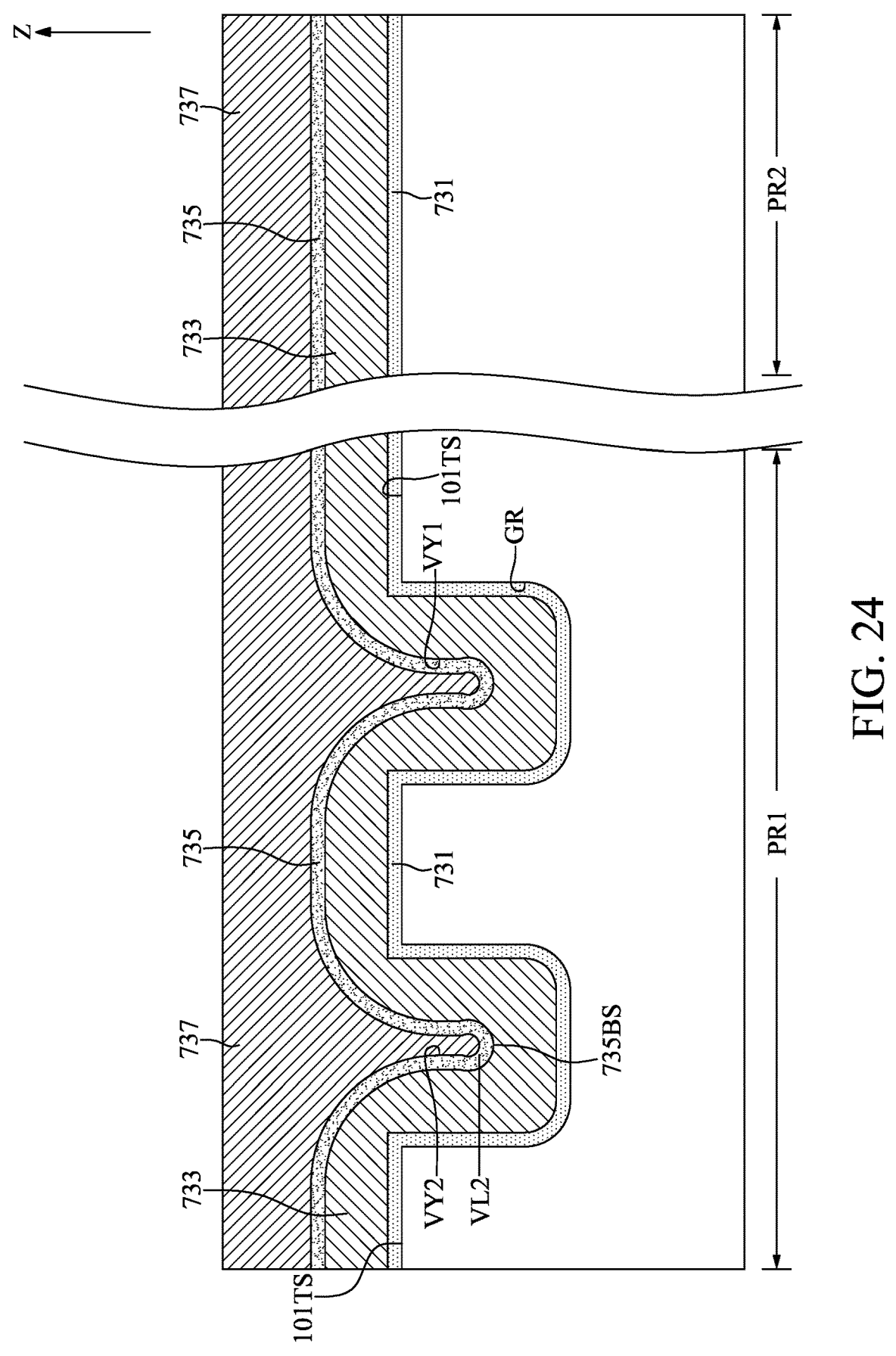

With reference to FIG. 24, a layer of top insulating material 737 may be formed on the layer of second conductive material 735 and may completely fill the second valleys VY2. In some embodiments, the top insulating material 737 may include, for example, silicon nitride, silicon oxynitride, silicon nitride oxide, or other applicable dielectric material. In some embodiments, the layer of top insulating material 737 may be formed by, for example, chemical vapor deposition, plasma-enhanced chemical vapor deposition, or other applicable deposition processes. A planarization process, such as chemical mechanical polishing, may be performed to remove excess material and provide a substantially flat surface for subsequent processing steps. In some embodiments, the bottom surface 737BS (or the bottom portion) of the layer of top insulating material 737 may be at a vertical level VL2 lower than the top surface 101TS of the substrate 101.

Figure 25:
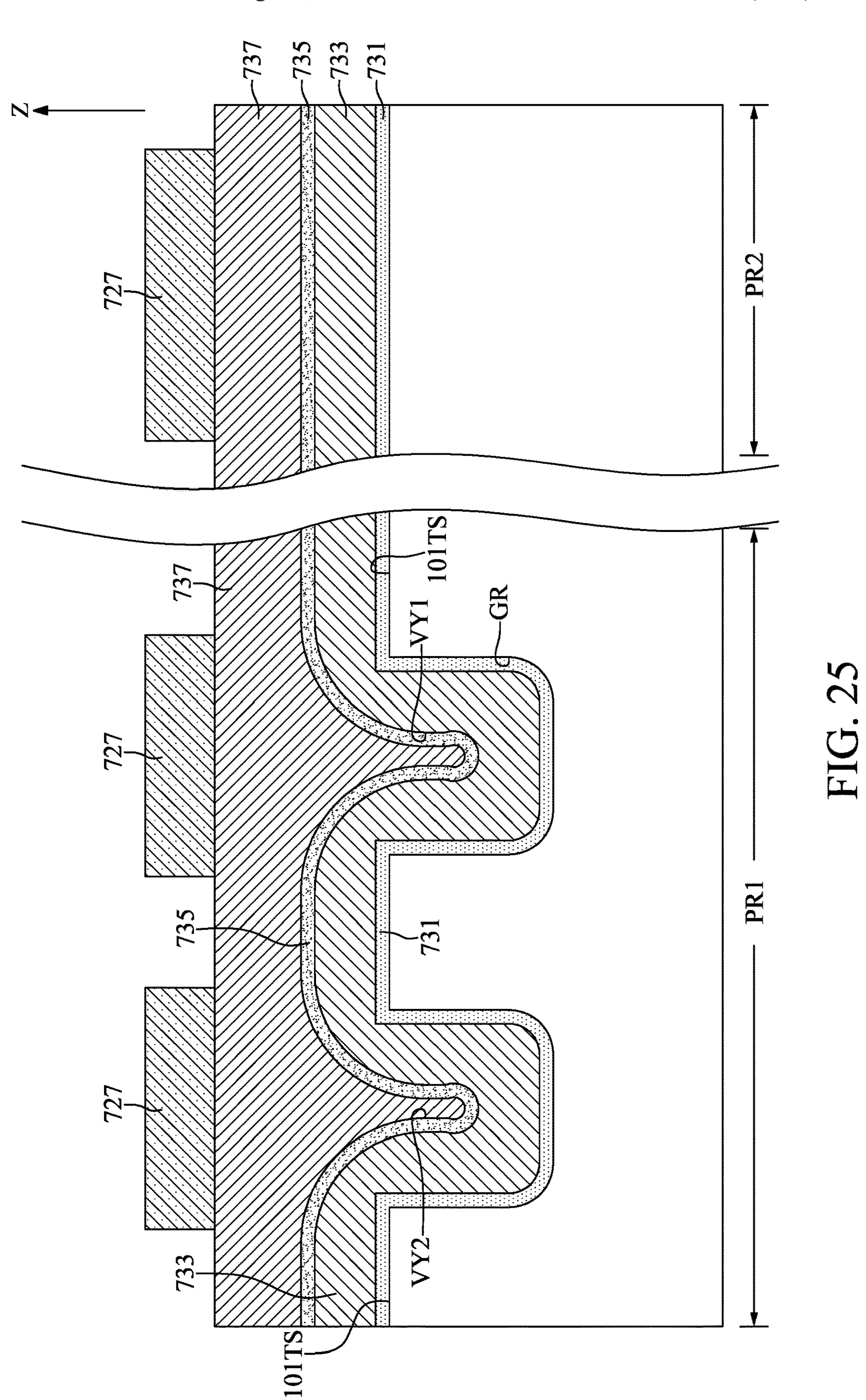

With reference to FIG. 25, a gate-mask layer 727 may be formed on the layer of top insulating material 737. In some embodiments, the gate-mask layer 727 may be a photoresist layer and may include the pattern of the peripheral gate structure 300 and the plurality of recessed gates 400.

Figure 26:
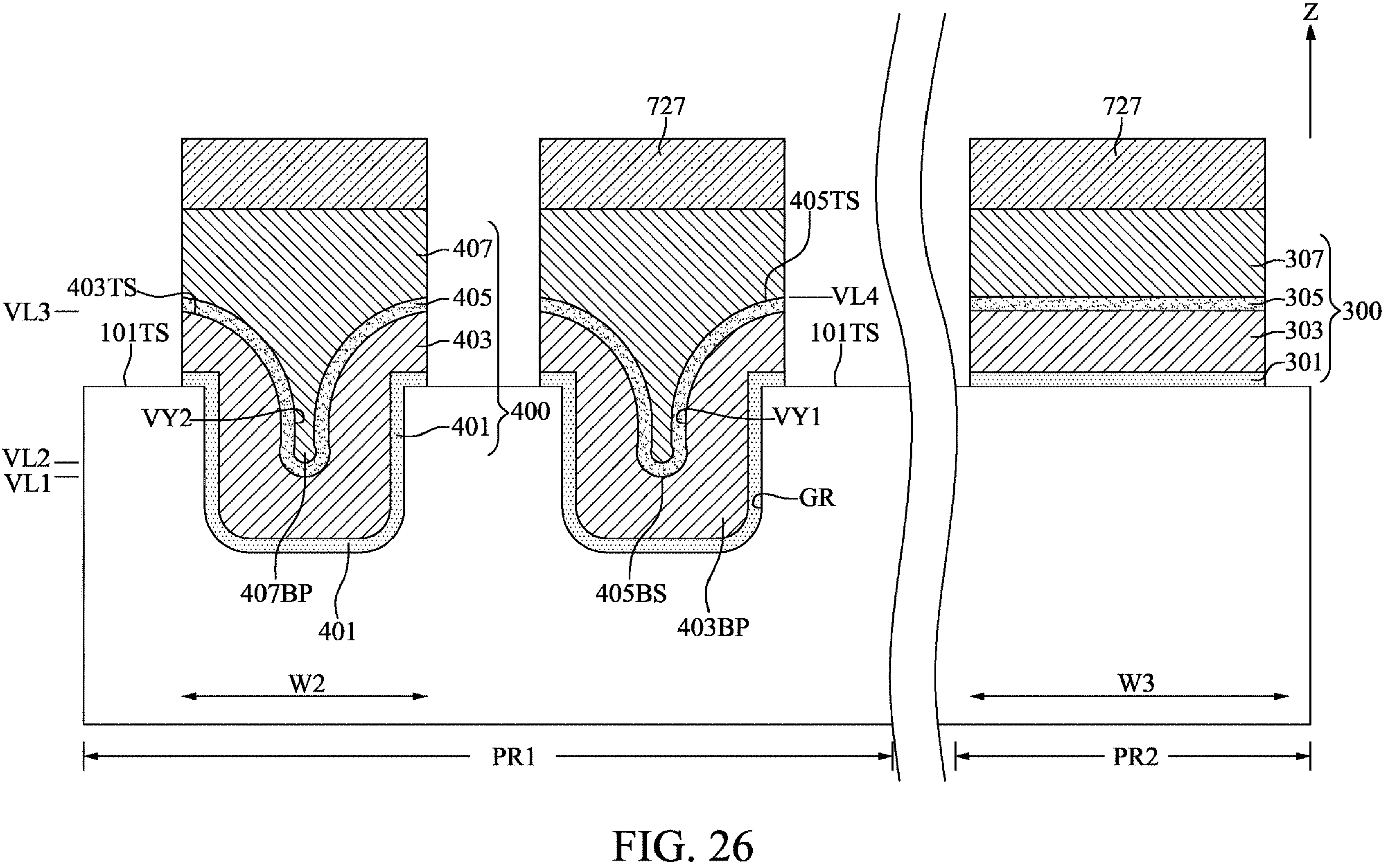
Figure 27:
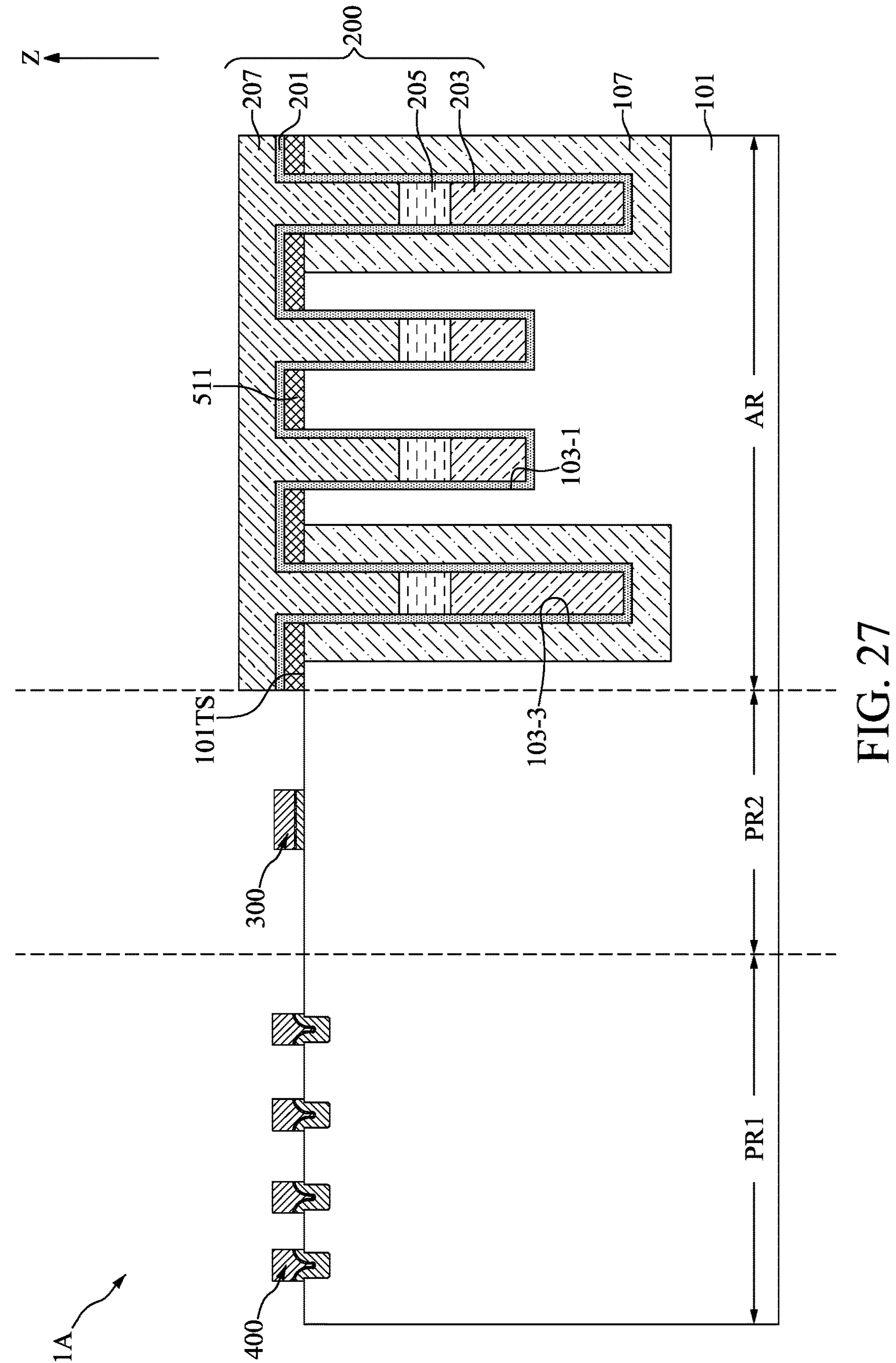
FIG. 27 illustrates, in a schematic cross-sectional view diagram, part of the flow for fabricating the semiconductor device in accordance with one embodiment of the present disclosure.

With reference to FIG. 26, a gate etching process may be performed to remove the portions, which are not masked by the gate-mask layer 727, of the layer of top insulating material 737, the layer of second conductive material 735, the layer of first conductive material 733, and the layer of gate dielectric material 731. In some embodiments, the gate etching process may be a multi-stage etching process. For example, the gate etching process may be a four-stage anisotropic dry etching process. The etching chemistry may be different for each stage to provide different etching selectivity.

With reference to FIG. 26, the remaining gate dielectric material 731 may be turned into a plurality of recessed gate dielectric layers 401 and a gate dielectric layer 301. For brevity, clarity, and convenience of description, only one recessed gate dielectric layer 401 is described. The recessed gate dielectric layer 401 may be conformally formed on the gate recess GR and may include a U-shaped, valley-shaped, or V-shaped cross-sectional profile. The two ends of the recessed gate dielectric layer 401 may extend in opposite directions, aligning with the top surface 101TS of the substrate 101. The gate dielectric layer 301 may be formed on the second peripheral region PR2. In some embodiments, the width W2 of the recessed gate dielectric layer 401 may be less than the width W3 of the gate dielectric layer 301.

With reference to FIG. 26, the remaining layer of first conductive material 733 may be turned into a plurality of recessed gate bottom conductive layers 403 and a gate bottom conductive layer 303. For brevity, clarity, and convenience of description, only one recessed gate bottom conductive layer 403 is described. The recessed gate bottom conductive layer 403 may be conformally formed on the recessed gate dielectric layer 401. The recessed gate bottom conductive layer 403 may exhibit a cross-sectional profile that is Valley-shaped, V-shaped, or U-shaped. Its bottom portion 403BP may be disposed within the gate recess GR, creating the first valley VY1. Both ends of the recessed gate bottom conductive layer 403 may protrude above the top surface 101TS of the substrate 101. The top portion of the top surface 403TS of the recessed gate bottom conductive layer 403 may be at the vertical level VL3, which is elevated compared to the top surface 101TS of the substrate 101. The gate bottom conductive layer 303 may be formed on the gate dielectric layer 301 and above the second peripheral region PR2.

With reference to FIG. 26, the remaining second conductive material 735 may be turned into a plurality of recessed gate top conductive layer 405 and a gate top conductive layer 305. For brevity, clarity, and convenience of description, only one recessed gate top conductive layer 405 is described. The recessed gate top conductive layer 405 may be conformally formed on the recessed gate bottom conductive layer 403. The recessed gate top conductive layer 405 may exhibit a cross-sectional profile that is Valley-shaped, V-shaped, or U-shaped. Its bottom portion may be disposed within the gate recess GR, creating the second valley VY2. Both ends of the recessed gate top conductive layer 405 may protrude above the top surface 101TS of the substrate 101. The top portion of the top surface 405TS of the recessed gate top conductive layer 405 may be at the vertical level VL4, which is elevated compared to the top surface 101TS of the substrate 101. Conversely, the bottom surface 405BS of the recessed gate top conductive layer 405 may be at the vertical level VL1, lower than the top surface 101TS of the substrate 101. The gate top conductive layer 305 may be formed on the gate bottom conductive layer 303 and above the second peripheral region PR2.

With reference to FIG. 26, the remaining top insulating material 737 may be turned into a plurality of recessed gate capping layer 407 and a gate capping layer 307. For brevity, clarity, and convenience of description, only one recessed gate capping layer 407 is described. The recessed gate capping layer 407 may be formed on the recessed gate top conductive layer 405. The bottom portion 407BP of the recessed gate capping layer 407 may have a reversed-triangular cross-sectional profile. The bottom portion 407BP (or the bottom surface) of the recessed gate capping layer 407 may be at the vertical level VL2 lower than the top surface 101TS of the substrate 101. The gate capping layer 307 may be formed on the gate top conductive layer 305. The recessed gate dielectric layer 401, the recessed gate bottom conductive layer 403, the recessed gate top conductive layer 405, and the recessed gate capping layer 407 together configure the recessed gate 400. The gate dielectric layer 301, the gate bottom conductive layer 303, the gate top conductive layer 305, and the gate capping layer 307 together configure the peripheral gate structure 300. In some embodiments, the width W2 of the recessed gate 400 may be less than the width W3 of the peripheral gate structure 300.

Compared to a gate structure with the same width W2 as the recessed gate 400, but with a planar gate dielectric layer (similar to the gate dielectric layer 301), the U-shaped cross-sectional profile of the recessed gate dielectric layer 401 can offer a longer channel length. Consequently, this can potentially mitigate or reduce the leakage issue in the semiconductor device 1A that includes the recessed gate 400. The improvement for leakage control may be beneficial to the miniaturization of gates.

With reference to FIG. 26, the gate dielectric layer 301 may possess a width, W3, that is greater than that of the recessed gate dielectric layer 401. This increased width allows the peripheral gate structure 300 to have a longer channel length, making it apt for supporting a larger drive current. This characteristic may be especially advantageous for power-related circuits. In some embodiments, the peripheral gate structure 300 and the recessed gate 400 may be provided for core circuits.

With reference to FIG. 27, the gate-mask layer 727 may be removed by ashing or other applicable semiconductor processes. It should be noted that the gate dielectric layer 301 and the recessed gate dielectric layer 401 are omitted in FIG. 27 for clarity. In some embodiments, the element density (or pattern density) of the first peripheral region PR1 may be greater than the element density of the second peripheral region PR2. The element density may be a value defined by the elements (e.g., the recessed gate 400 or peripheral gate structure 300) formed on the first peripheral region PR1 (or the second peripheral region PR2) divided by the surface area of the first peripheral region PR1 (or the second peripheral region PR2 from a top-view perspective). In some embodiments, from a cross-sectional perspective, a greater element density may mean a smaller distance between an adjacent pair of elements. In other words, the element density of the elements may be inversely proportional to the critical dimension of the elements. As shown in FIG. 27, more recessed gates 400 are shown to emphasize that the first peripheral region PR1 has a greater element density than that of the second peripheral region PR2. It should be noted that numbers of the recessed gates 400 or the peripheral gate structure 300 shown in FIG. 27 are illustrative only.

Utilizing the recessed gate dielectric layer 401 can effectively control the leakage issue associated with smaller gate sizes. Furthermore, both the recessed gates (e.g., recessed gate 400) and the planar gates (e.g., peripheral gate structure 300) can be fabricated simultaneously, potentially leading to reduced manufacturing costs.

FIGS. 28 to 31 illustrate, in schematic cross-sectional view diagrams, a flow for fabricating a semiconductor device 1B in accordance with another embodiment of the present disclosure.

Figure 28:
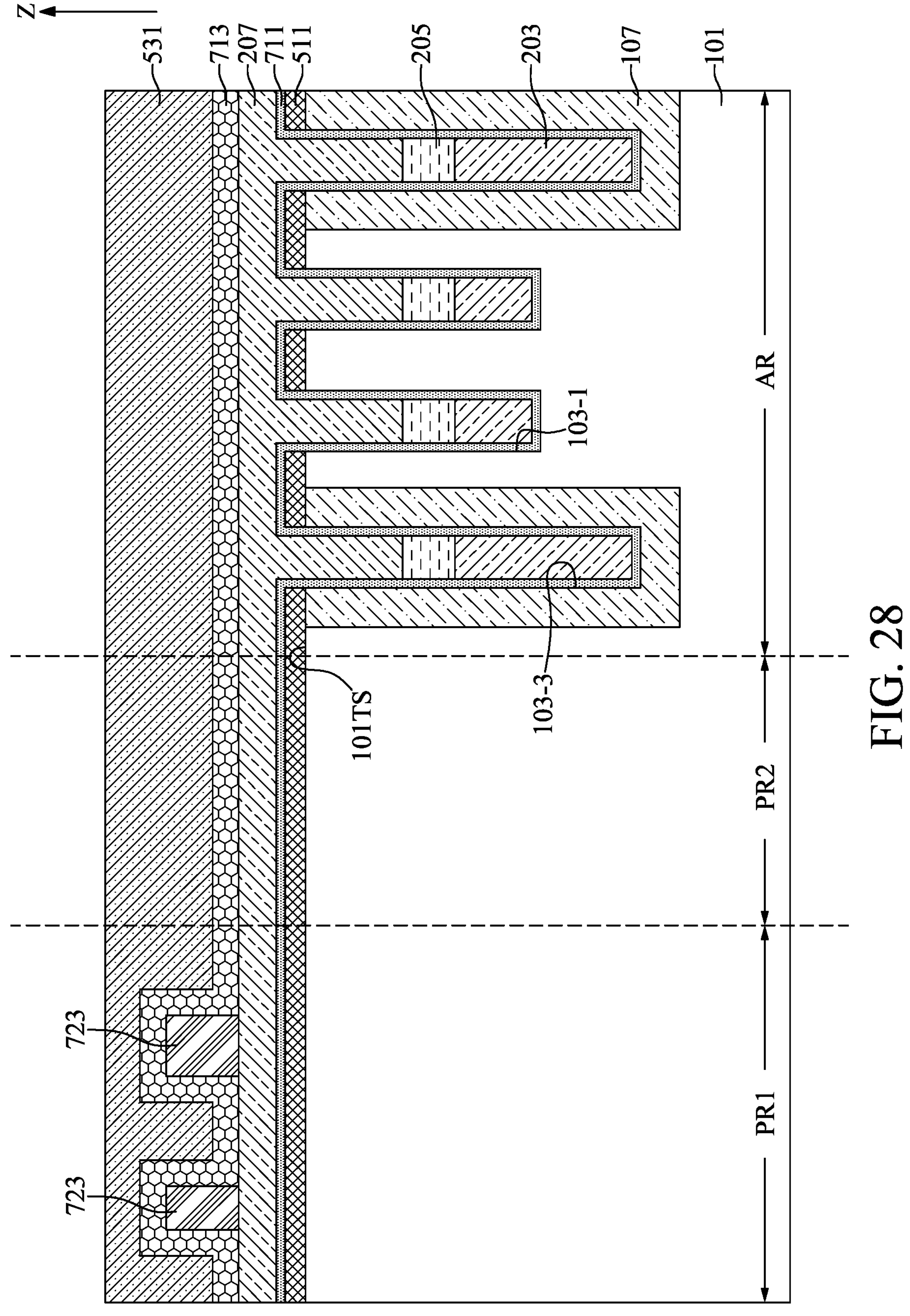
FIGS. 28 to 31 illustrate, in schematic cross-sectional view diagrams, a flow for fabricating a semiconductor device in accordance with another embodiment of the present disclosure.

With reference to FIG. 28, an intermediate semiconductor device may be fabricated with a procedure similar to that illustrated in FIGS. 2 to 11, and descriptions thereof are not repeated herein. An under layer 531 may be formed to cover the layer of spacer material 713 with a procedure similar to that illustrated in FIG. 13, and descriptions thereof are not repeated herein.

Figure 29:
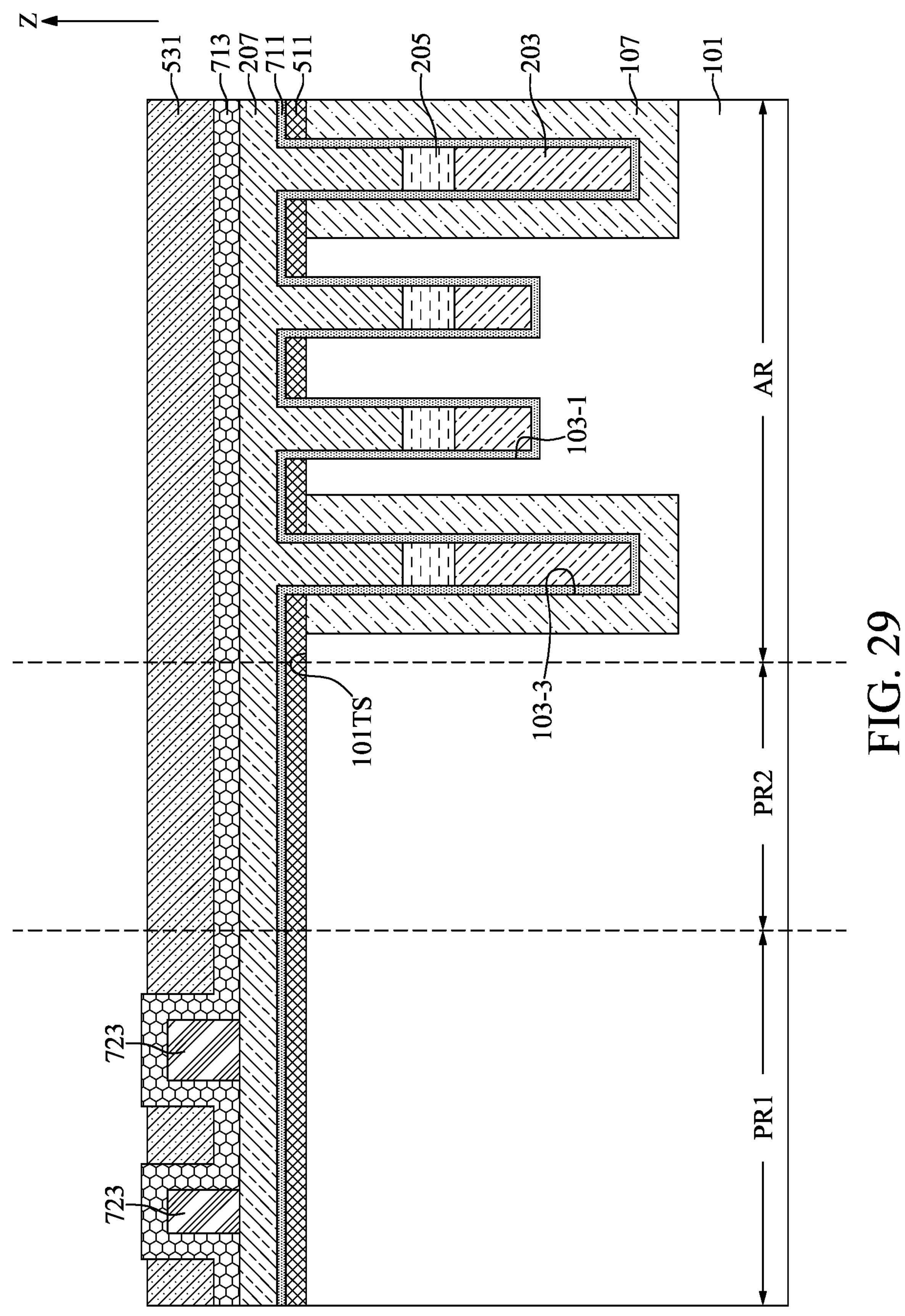

With reference to FIG. 29, a recessing process may be performed to lower the top surface of the under layer 531. In some embodiments, the recessing process may be an etching process having etching selectivity to the under layer 531. In some embodiments, the recessing process may be an isotropic etching process such as wet etching process. In some embodiments, the etch rate ratio of the under layer 531 to the spacer material 713 may be between about 100:1 and about 5:1, between about 15:1 and about 5:1, or between about 10:1 and about 5:1 during the recessing process. In some embodiments, the end point of the recessing process may be determined by the signal of the spacer material 713. After the recessing process, the top surface of the layer of spacer material 713 may be exposed. In comparison to FIG. 14, the surface area of the top surface of the layer of spacer material 713 is larger than the combined surface areas of the plurality of sacrificial spacers 515. This increase in surface area can simplify end point detection in the present embodiment.

Figure 30:
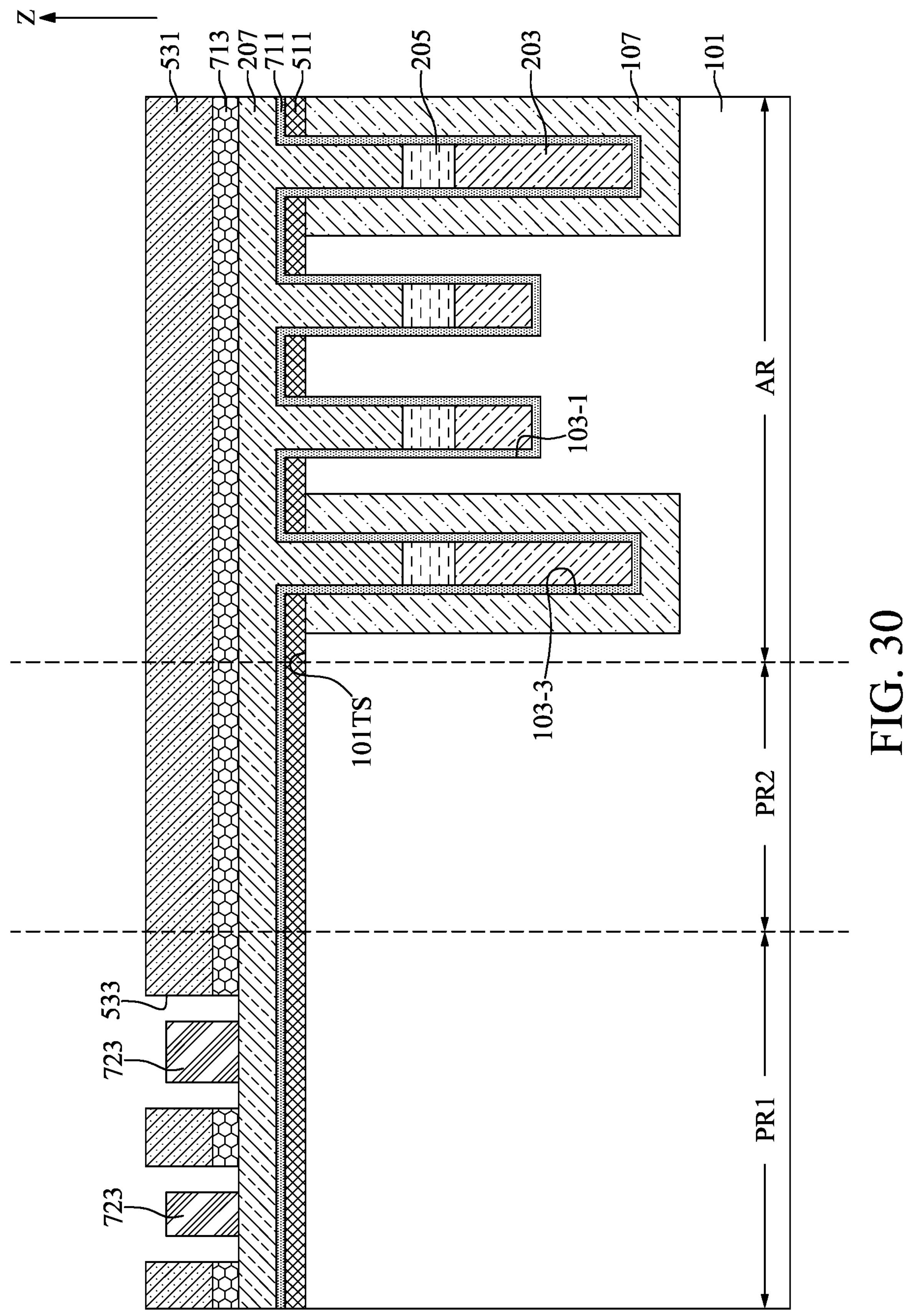

With reference to FIG. 30, a selective removal process may be performed to selectively remove portions of the spacer material 713 so as to form the plurality of openings 533. The selective removal process may be performed with a procedure similar to that illustrated in FIG. 15, and descriptions thereof are not repeated herein.

Figure 31:
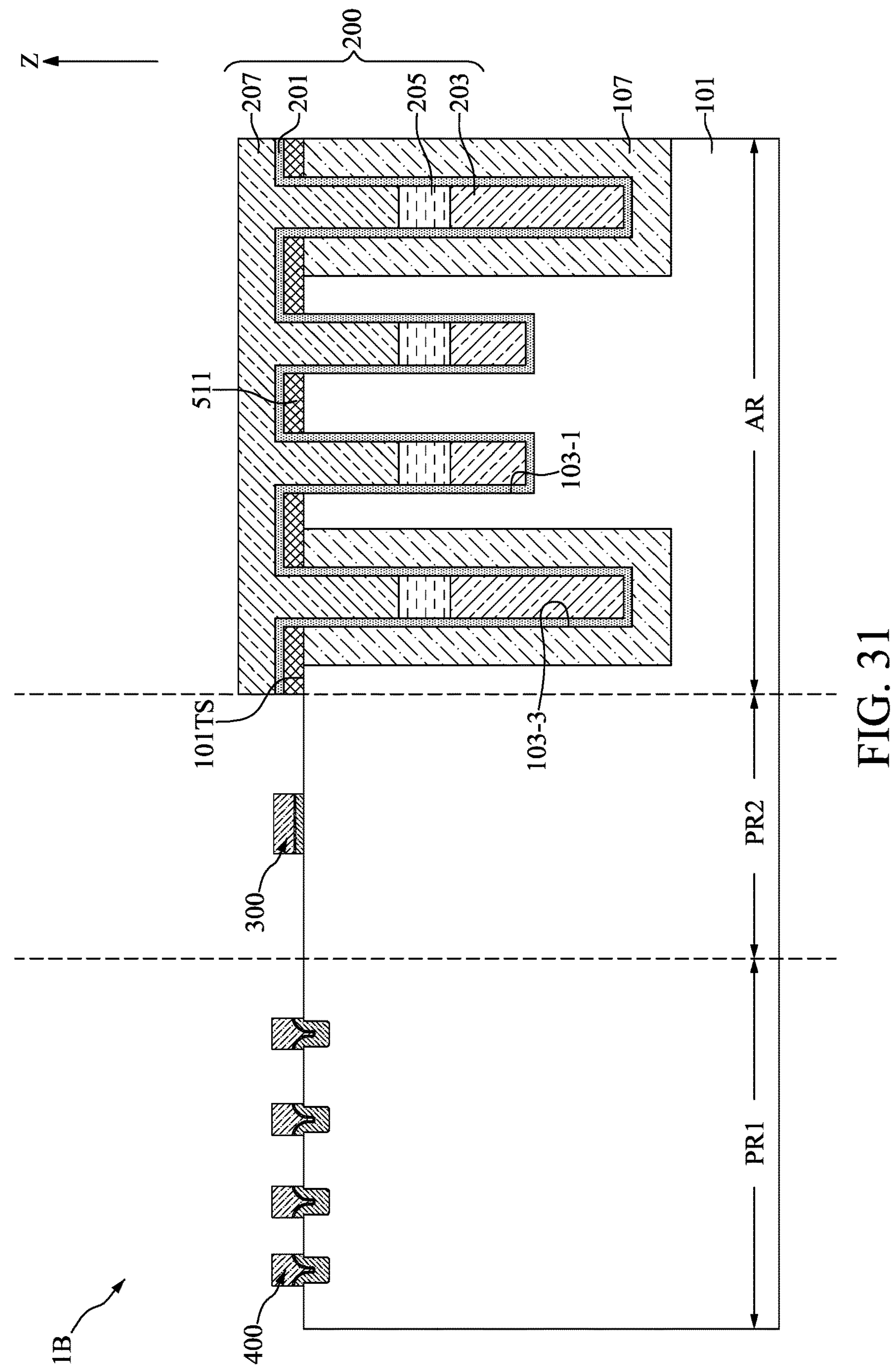

With reference to FIG. 31, the peripheral gate structure 300 and the recessed gate 400 may be formed with a procedure similar to that illustrated in FIGS. 16 to 27, and descriptions thereof are not repeated herein.

One aspect of the present disclosure provides a semiconductor device including a substrate; a recessed gate dielectric layer inwardly positioned in the substrate and including a U-shaped cross-sectional profile; a recessed gate bottom conductive layer positioned on the recessed gate dielectric layer and including a valley-shaped cross-sectional profile, resulting in a first valley; a recessed gate top conductive layer conformally positioned on the first valley of the recessed gate bottom conductive layer; and a recessed gate capping layer positioned on the recessed gate top conductive layer.

Another aspect of the present disclosure provides a semiconductor device including a substrate including a first peripheral region and a second peripheral region; a plurality of recessed gates respectively including a recessed gate dielectric layer inwardly positioned in the first peripheral region and including a U-shaped cross-sectional profile, a recessed gate bottom conductive layer positioned on the recessed gate dielectric layer and including a valley-shaped cross-sectional profile, resulting in a first valley, a recessed gate top conductive layer conformally positioned on the first valley of the recessed gate bottom conductive layer, and a recessed gate capping layer positioned on the recessed gate top conductive layer; and a peripheral gate structure positioned on the second peripheral region. An element density of the first peripheral region is greater than an element density of the second peripheral region.

Another aspect of the present disclosure provides a method for fabricating a semiconductor device including providing a substrate including a first peripheral region and a second peripheral region; forming a mandrel layer on the first peripheral region; conformally forming a layer of spacer material on the substrate and covering the mandrel layer; performing a spacer etching process to turn the layer of spacer material into a plurality of sacrificial spacers on sides of the mandrel layer; forming an under layer on the substrate and covering the mandrel layer and the plurality of sacrificial spacers; recessing the under layer to expose the mandrel layer and the plurality of sacrificial spacers; selectively removing the plurality of sacrificial spacers to expose the first peripheral region; forming a plurality of gate recesses in the first peripheral region; and forming a plurality of recessed gates on the plurality of gate recesses.

Due to the design of the semiconductor device of the present disclosure, the leakage issue associated with smaller gate sizes may be effectively controlled by utilizing the recessed gate dielectric layer 401. Furthermore, both the recessed gates (e.g., recessed gate 400) and the planar gates (e.g., peripheral gate structure 300) can be fabricated simultaneously, potentially leading to reduced manufacturing costs.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:

providing a substrate comprising a first peripheral region and a second peripheral region;

forming a mandrel layer on the first peripheral region;

conformally forming a layer of spacer material on the substrate and covering the mandrel layer;

performing a spacer etching process to turn the layer of spacer material into a plurality of sacrificial spacers on sides of the mandrel layer;

forming an under layer on the substrate and covering the mandrel layer and the plurality of sacrificial spacers;

recessing the under layer to expose the mandrel layer and the plurality of sacrificial spacers;

selectively removing the plurality of sacrificial spacers to expose the first peripheral region;

forming a plurality of gate recesses in the first peripheral region; and forming a plurality of recessed gates on the plurality of gate recesses;

wherein the layer of spacer material is formed by atomic layer deposition;

wherein forming the plurality of recessed gates on the plurality of gate recesses comprises:

conformally forming a layer of gate dielectric material on both the substrate and within the plurality of gate recesses;

forming a layer of first conductive material on the layer of gate dielectric material, resulting in the formation of a plurality of first valleys within the plurality of gate recesses, respectively and correspondingly;

conformally forming a layer of second conductive material on the layer of first conductive material, resulting in the formation of a plurality of second valleys within the plurality of gate recesses, respectively and correspondingly;

forming a layer of top insulating material on the layer of second conductive material, completely filling the plurality of second valleys; and patterning the layer of gate dielectric material, the layer of first conductive material, the layer of second conductive material, and the layer of top insulating material to form, respectively and correspondingly, a plurality of recessed gate dielectric layers, a plurality of recessed gate bottom conductive layers, a plurality of recessed gate top conductive layers, and a plurality of recessed gate capping layers within the plurality of gate recesses;

wherein the plurality of recessed gate dielectric layers, the plurality of recessed gate bottom conductive layers, the plurality of recessed gate top conductive layers, and the plurality of recessed gate capping layers together configure the plurality of recessed gates.

2. The method for fabricating the semiconductor device of claim 1, wherein the gate dielectric material comprises oxides, nitrides, oxynitrides, metal silicates, aluminates, titanates, nitrides, high-k dielectric materials, or a combination thereof.

3. The method for fabricating the semiconductor device of claim 2, wherein the first conductive material comprises polycrystalline silicon, polycrystalline germanium, polycrystalline silicon germanium, doped polycrystalline silicon, doped polycrystalline germanium, or doped polycrystalline silicon germanium.

4. The method for fabricating the semiconductor device of claim 3, wherein the second conductive material comprises tungsten, cobalt, zirconium, tantalum, titanium, aluminum, ruthenium, copper, metal carbides, metal nitrides, transition metal aluminides, or a combination thereof.

5. The method for fabricating the semiconductor device of claim 4, wherein the top insulating material comprises silicon nitride, silicon oxynitride, or silicon nitride oxide.

6. The method for fabricating the semiconductor device of claim 5, further comprising forming a peripheral gate structure on the second peripheral region.

7. The method for fabricating the semiconductor device of claim 6, wherein the plurality of recessed gates and the peripheral gate structure are synchronously formed.

8. The method for fabricating the semiconductor device of claim 7, wherein an element density of the first peripheral region is greater than an element density of the second peripheral region.

9. The method for fabricating the semiconductor device of claim 8, wherein a process temperature of forming the layer of spacer material is between about 320° C. and about 530° C.

10. The method for fabricating the semiconductor device of claim 9, wherein the atomic layer deposition of forming the layer of spacer material comprises a silicon-containing precursor and an oxygen-containing precursor.

11. The method for fabricating the semiconductor device of claim 10, wherein the atomic layer deposition of forming the layer of spacer material comprises pyridine.

12. The method for fabricating the semiconductor device of claim 11, wherein the silicon-containing precursor comprises hexachlorodisilane, dichlorosilane, silane, disilane, trichiorosilane, or a combination thereof.

13. The method for fabricating the semiconductor device of claim 12, wherein the oxygen-containing precursor comprises water.

* * * * *